(12) United States Patent
Billa et al.

(10) Patent No.: US 11,309,908 B2
(45) Date of Patent: Apr. 19, 2022

(54) STATIC DICTIONARY-BASED COMPRESSION HARDWARE PIPELINE FOR DATA COMPRESSION ACCELERATOR OF A DATA PROCESSING UNIT

(71) Applicant: Fungible, Inc., Santa Clara, CA (US)

(72) Inventors: Satyanarayana Lakshmipathi Billa, Sunnyvale, CA (US); Rajan Goyal, Saratoga, CA (US); Edward David Beckman, Santa Clara, CA (US)

(73) Assignee: Fungible, Inc., Santa Clara, CA (US)

( * ) Notice: Subject to any disclaimer, the term of this patent is extended or adjusted under 35 U.S.C. 154(b) by 270 days.

(21) Appl. No.: 16/200,484

(22) Filed: Nov. 26, 2018

(65) Prior Publication Data

US 2020/0169268 A1    May 28, 2020

(51) Int. Cl.
*H03M 7/30*      (2006.01)
*G06F 16/953*    (2019.01)
(Continued)

(52) U.S. Cl.
CPC ........ *H03M 7/3088* (2013.01); *G06F 16/258* (2019.01); *G06F 16/953* (2019.01); *H03M 7/40* (2013.01)

(58) Field of Classification Search
CPC .... H03M 7/3088; H03M 7/40; H03M 7/3095; H03M 7/6029; H03M 7/6011; H03M 7/3084; G06F 16/953; G06F 16/258
(Continued)

(56) References Cited

U.S. PATENT DOCUMENTS

| 5,126,739 A | 6/1992 | Whiting et al. |
| 5,155,484 A | 10/1992 | Chambers, IV |

(Continued)

FOREIGN PATENT DOCUMENTS

EP    0913825 A2    6/1999

OTHER PUBLICATIONS

International Search Report and Written Opinion of International Application No. PCT/US2019/062930 dated Mar. 23, 2020, 15 pp.
(Continued)

*Primary Examiner* — Hicham Skhoun
(74) *Attorney, Agent, or Firm* — Shumaker & Sieffert, P.A.

(57) ABSTRACT

A highly programmable device, referred to generally as a data processing unit, having multiple processing units for processing streams of information, such as network packets or storage packets, is described. The data processing unit includes one or more specialized hardware accelerators configured to perform acceleration for various data processing functions. This disclosure describes a programmable hardware-based data compression accelerator that includes a pipeline for performing static dictionary-based and dynamic history-based compression on streams of information, such as network packets. The search block may support single and multi-thread processing, and multiple levels of compression effort. To achieve high-compression, the search block may operate at a high level of effort that supports a single thread and use of both a dynamic history of the input data stream and a static dictionary of common words. The static dictionary may be useful in achieving high-compression where the input data stream is relatively small.

28 Claims, 14 Drawing Sheets

(51) Int. Cl.
*G06F 16/25* (2019.01)
*H03M 7/40* (2006.01)
(58) Field of Classification Search
USPC .......................................................... 707/707
See application file for complete search history.

(56) References Cited

U.S. PATENT DOCUMENTS

| | | | |
|---|---|---|---|
| 5,426,779 A | 6/1995 | Chambers, IV | |
| 5,455,577 A | 10/1995 | Slivka et al. | |
| 5,525,982 A | 6/1996 | Cheng et al. | |
| 5,572,206 A | 11/1996 | Miller et al. | |
| 5,778,255 A | 7/1998 | Clark et al. | |
| 5,805,086 A | 9/1998 | Brown et al. | |
| 5,936,560 A * | 8/1999 | Higuchi | H03M 7/3084 341/106 |
| 7,283,072 B1 * | 10/2007 | Plachta | H03M 7/3088 341/107 |
| 8,095,508 B2 | 1/2012 | Chamberlain et al. | |
| 8,350,732 B2 | 1/2013 | Carlson | |
| 8,456,331 B2 | 6/2013 | Carlson | |
| 8,766,827 B1 | 7/2014 | Milne et al. | |
| 8,838,544 B2 | 9/2014 | Biran et al. | |
| 8,838,551 B2 * | 9/2014 | Fanghaenel | G06F 16/2272 707/693 |
| 9,054,729 B2 | 6/2015 | Carlson | |
| 9,077,368 B2 | 7/2015 | Miller et al. | |
| 9,166,620 B2 | 10/2015 | Jayaraman et al. | |
| 9,325,813 B2 | 4/2016 | Jayaraman et al. | |
| 9,363,339 B2 | 6/2016 | Bhaskar et al. | |
| 9,584,155 B1 * | 2/2017 | Gopal | H03M 7/3086 |
| 9,680,500 B2 | 6/2017 | Bhaskar et al. | |
| 9,697,221 B2 * | 7/2017 | Patthak | G06F 12/04 |
| 9,768,802 B2 | 9/2017 | Gopal et al. | |
| 9,825,648 B1 | 11/2017 | Gopal et al. | |
| 9,853,660 B1 | 12/2017 | Gopal et al. | |
| 10,224,956 B2 | 3/2019 | Gopal et al. | |
| 10,224,957 B1 * | 3/2019 | Cassetti | G06F 16/24568 |
| 10,277,716 B2 | 4/2019 | Bhaskar et al. | |
| 10,528,539 B2 * | 1/2020 | Guilford | G06F 3/0673 |
| 10,567,458 B2 | 2/2020 | Bhaskar et al. | |
| 2003/0204584 A1 | 10/2003 | Zeira et al. | |
| 2007/0150497 A1 | 6/2007 | De La Cruz et al. | |
| 2009/0077252 A1 | 3/2009 | Abdo et al. | |
| 2011/0043387 A1 * | 2/2011 | Abali | H03M 7/3088 341/51 |
| 2011/0307659 A1 | 12/2011 | Hans et al. | |
| 2012/0262314 A1 * | 10/2012 | Carlson | H03M 7/3084 341/87 |
| 2012/0286979 A1 | 11/2012 | Carlson | |
| 2013/0249716 A1 | 9/2013 | Carlson | |
| 2014/0223029 A1 * | 8/2014 | Bhaskar | H04L 69/04 709/247 |
| 2017/0250708 A1 * | 8/2017 | Blaettler | G06F 3/0608 |
| 2018/0026653 A1 * | 1/2018 | Cutter | G06F 13/4068 341/51 |
| 2018/0287965 A1 | 10/2018 | Sindhu et al. | |
| 2018/0293168 A1 | 10/2018 | Noureddine et al. | |
| 2019/0012278 A1 | 1/2019 | Sindhu et al. | |
| 2019/0012350 A1 | 1/2019 | Sindhu et al. | |
| 2019/0013965 A1 | 1/2019 | Sindhu et al. | |

OTHER PUBLICATIONS

Salomon, "Data Compression: The Complete Referenc," Chapter 3, Dictionary Methods, Jan. 1998, pp. 101-162.
"Hash Table," Wikipedia, the free encyclopedia, retrieved from https:l/en.wikipedla.orglw/Index.php?tltle=Hash_table&oldld= 866368727, on Mar. 4, 2020, 18 pp.
Deutsch, "Deflate Compressed Data Format Specification version 1.3," Internet Draft Deflate 1.3, Feb. 1, 1996, 15 pp.
U.S. Appl. No. 15/949,692, filed Apr. 10, 2018, naming inventors Wael et al.
U.S. Appl. No. 16/197,179, filed Nov. 20, 2018, naming inventors Grey et al.
U.S. Appl. No. 16/195,564, filed Nov. 19, 2018, naming inventors Beckman et al.
U.S. Appl. No. 16/195,209, filed Nov. 19, 2018, naming inventors Beckman et al.
U.S. Appl. No. 16/195,290, filed Nov. 19, 2018, naming inventors Beckman et al.
U.S. Appl. No. 16/195,617, filed Nov. 19, 2018, naming inventors Beckman et al.
U.S. Appl. No. 16/195,644, filed Nov. 19, 2018, naming inventors Beckman et al.
Deutsch, "DEFLATE Compressed Data Format Specification version 1.3," Network Working Group, RFC 1951, May 1996, 15 pp.
"Range encoding," Wikipedia, the free encyclopedia, accessed from https://en.wikipedia.org/wiki/Range_encoding on or about May 7, 2019, last edit made Jan. 2, 2019, 6 pp.
"Lempel-Ziv-Markov chain algorithm," Wikipedia, the free encyclopedia, accessed from https://en.wikipedia.org/wiki/Lempel-Ziv-Markov_chain_algorithm on or about May 7, 2019, last edit made Mar. 17, 2019, 15 pp.
"Lloyd/ easylzma," GitHub, accessed from https://github.com/lloyd/easylzma on or about May 7, 2019, last commit made Apr. 1, 2009, 2 pp.
Martin, "Range encoding: an algorithm for removing redundancy from a digitised message," Video & Data Recording Conference, Mar. 1979, 11 pp.
International Preliminary Report on Patentability from International Application No. PCT/US2019/062930, dated Jun. 10, 2021, 10 pp.

* cited by examiner

STATIC DICTIONARY-BASED COMPRESSION HARDWARE PIPELINE FOR DATA COMPRESSION ACCELERATOR OF A DATA PROCESSING UNIT

TECHNICAL FIELD

The disclosure relates to processing packets of information, for example, in the fields of networking and storage.

BACKGROUND

In a typical computer network, a large collection of interconnected servers provides computing and/or storage capacity for execution of various applications. A data center is one example of a large-scale computer network and typically hosts applications and services for subscribers, i.e., customers of the data center. The data center may, for example, host all of the infrastructure equipment, such as compute nodes, networking and storage systems, power systems, and environmental control systems. In most data centers, clusters of storage systems and application servers are interconnected via a high-speed switch fabric provided by one or more tiers of physical network switches and routers. Data centers vary greatly in size, with some public data centers containing hundreds of thousands of servers, and are usually distributed across multiple geographies for redundancy.

Many devices within a computer network, e.g., storage/compute servers, firewalls, intrusion detection devices, switches, routers or other network attached devices, often use general purpose processors, including multi-core processing systems, to process data, such as network or storage data. However, general purpose processing cores and multi-processing systems are normally not designed for high-capacity network and storage workloads of modern network and can be relatively poor at performing packet stream processing.

SUMMARY

In general, this disclosure describes a highly programmable device, referred to generally as a data processing unit, having multiple processing units for processing streams of information, such as network packets or storage packets. In some examples, the processing units may be processing cores, and in other examples, the processing units may be virtual processors, hardware threads, hardware blocks, or other sub-processing core units. As described herein, the data processing unit includes one or more specialized hardware accelerators configured to perform acceleration for various data processing functions.

In various examples, this disclosure describes a hardware-based programmable data compression accelerator of the data processing unit that includes a pipeline for performing static dictionary-based and dynamic history-based compression on streams of information, such as network packets. The data compression accelerator comprises computer hardware used by the data processing unit to perform data compression functions more efficiently than in typical software-based compression running on general-purpose processors. The disclosed static dictionary-based and dynamic history-based compression pipeline, referred to herein as a "search block," is configured to perform string search and replacement functions to compress an input data stream. In some examples, the search block performs a first stage of a two-stage compression process implemented by the data compression accelerator. The second stage of the compression process includes application of entropy coding, such as by using either a Huffman coding block or a Range coding block, as examples.

As further described herein, in various examples, the search block of the hardware-based accelerator replaces a string of bytes in the input data stream with a reference to either a previous occurrence of the same string of bytes stored in a dynamic history of the input data stream or a common word of a given length stored in a static dictionary to achieve compression. To accomplish this, in example implementations, the search block includes hardware sub-blocks referred to as a hash block, a match block, and a path block. The hash block is configured to prepare a 'history key' at a current byte position in the input data stream by selecting 'N' number of bytes starting with the current byte position and use the key to calculate a hash index into a history address hash table. The hash block uses the hash index to access a bucket of the history address hash table that contains history addresses of previous occurrences of byte strings stored in a history buffer. The hash block is also configured to a prepare a 'dictionary key' at the current byte position and use truncated versions of the key to calculate multiple hash indices in parallel as static dictionary addresses of common words having different words lengths stored in the static dictionary. The hash block then sends the history addresses of the previous occurrences to the match block and records the current byte position address into the same bucket in the history address hash table. The hash block also sends the dictionary addresses of the common words to the match block.

The match block is configured to determine whether string matches have occurred by comparing the byte string beginning at the current byte position in the input data stream to the previous occurrences of byte strings stored in a history buffer at the history addresses received from the hash block and to the common words having the different words lengths stored in the static dictionary at the dictionary addresses received from the hash block. In this way, for the current byte position, the match block may determine matches from both the dynamic history and the static dictionary, and send the matches to the path block. The path block is configured to select the longest and closest match at the current byte position and merge consecutive matches to form a longer match. The path block may also be configured to support lazy match in which the path block determines whether it is better to output a length-distance pair to represent a match beginning at the current byte position or to output a literal for the current byte position based on matches at other byte positions within a configurable window.

The search block may support single and multi-thread processing, and multiple levels of effort with the level of compression increasing with the effort level. In accordance with the techniques of this disclosure, in order to achieve high-compression, the search block may operate at a high level of effort that supports a single thread and use of both a dynamic history of the input data stream and a static dictionary of common words. The static dictionary may be especially useful in achieving high-compression in cases where the input data stream used to build the dynamic history is not large enough for self-referential strings to be advantageous or otherwise provide a sufficient amount of history for byte string matching.

In one example, this disclosure is directed to a method comprising receiving, by a search engine implemented as a pipeline of a processing device, an input data stream to be compressed; identifying, by the search engine, one or more dictionary addresses of one or more words having different word lengths stored in a static dictionary that potentially match a current byte string beginning at a current byte position in the input data stream; determining, by the search engine, whether at least one match occurs for the current byte string from among the one or more words at the dictionary addresses; selecting, by the search engine, an output for the current byte position, wherein the output for the current byte position comprises one of a reference to a match for the current byte string or a literal of original data at the current byte position; and transmitting, by the search engine, the selected output for the current byte position in an output data stream.

In another example, this disclosure is directed to a processing device comprising a memory, and a search engine implemented as a pipeline of the processing device. The search engine is configured to receive an input data stream to be compressed, identify one or more dictionary addresses of one or more words having different word lengths stored in a static dictionary that potentially match a current byte string beginning at a current byte position in the input data stream, determine whether at least one match occurs for the current byte string from among the one or more words at the dictionary addresses, select an output for the current byte position, wherein the output for the current byte position comprises one of a reference to a match for the current byte string or a literal of original data at the current byte position, and transmit the selected output for the current byte position in an output data stream.

The details of one or more examples are set forth in the accompanying drawings and the description below. Other features, objects, and advantages of the invention will be apparent from the description and drawings, and from the claims.

DETAILED DESCRIPTION

Figure 1:
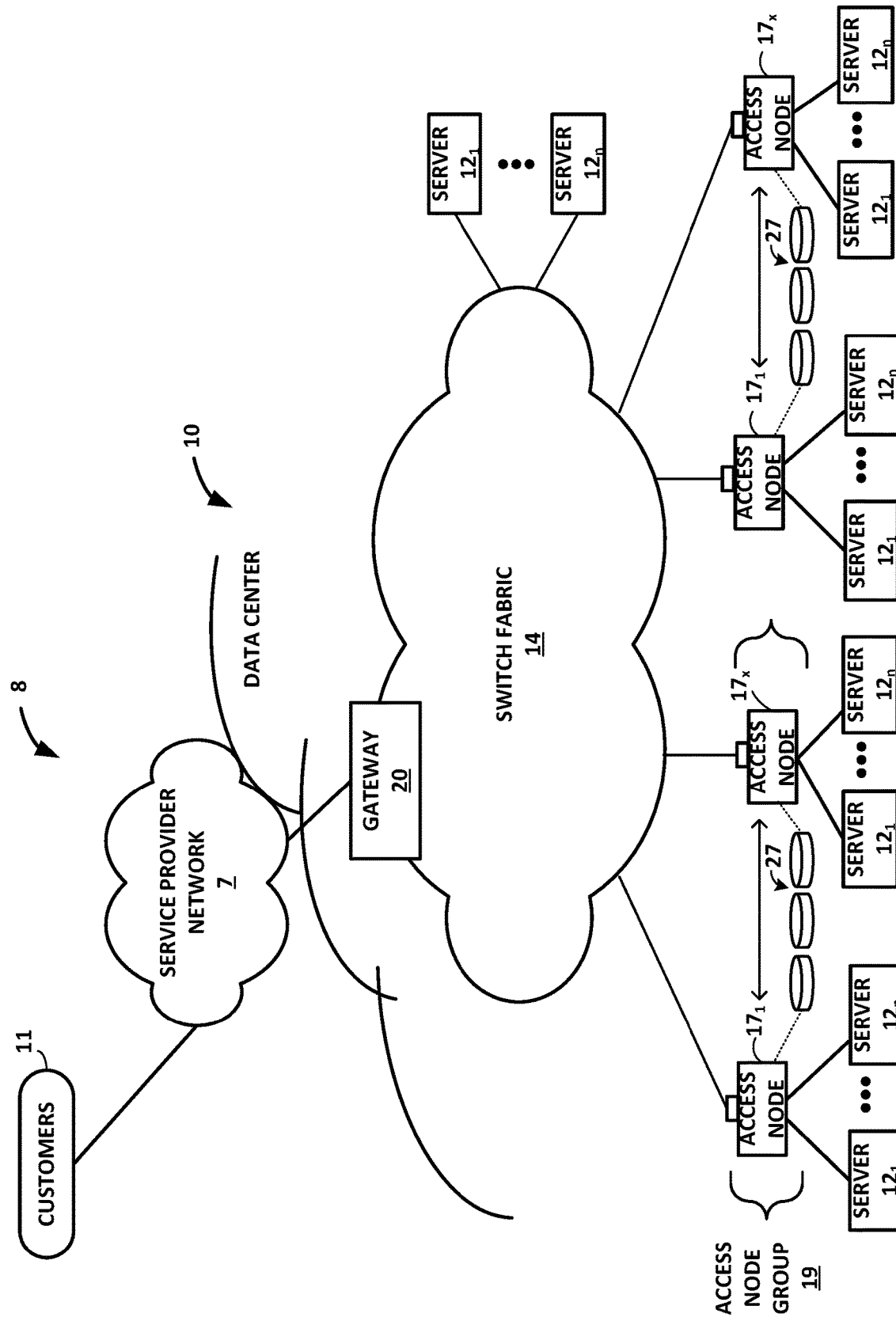
FIG. 1 is a block diagram illustrating an example system including one or more network devices configured to efficiently process a series of work units in a multiple core processor system.

FIG. 1 is a block diagram illustrating an example system 8 including one or more network devices configured to efficiently process a series of work units in a multiple core processor system. As described herein, techniques for caching and prefetching data from non-coherent memory may provide technical benefits that include improving the efficiency and utilization of processing cores within access nodes 17 in FIG. 1. Access nodes may also be referred to as data processing units (DPUs), or devices including DPUs, in this disclosure. In the example of FIG. 1, various data structures and processing techniques are described with respect to access nodes 17 within a data center 10. Other devices within a network, such as routers, switches, servers, firewalls, gateways and the like, having multiple core processor systems may readily be configured to utilize the data processing techniques described herein.

Data center 10 represents an example of a system in which various techniques described herein may be implemented. In general, data center 10 provides an operating environment for applications and services for customers 11 coupled to the data center by service provider network 7 and gateway device 20. Data center 10 may, for example, host infrastructure equipment, such as compute nodes, networking and storage systems, redundant power supplies, and environmental controls. Service provider network 7 may be coupled to one or more networks administered by other providers, and may thus form part of a large-scale public network infrastructure, e.g., the Internet.

In some examples, data center 10 may represent one of many geographically distributed network data centers. In the example of FIG. 1, data center 10 is a facility that provides information services for customers 11. Customers 11 may be collective entities such as enterprises and governments or individuals. For example, a network data center may host web services for several enterprises and end users. Other exemplary services may include data storage, virtual private networks, file storage services, data mining services, scientific- or super-computing services, and so on.

In the illustrated example, data center 10 includes a set of storage systems and application servers 12 interconnected via a high-speed switch fabric 14. In some examples, servers 12 are arranged into multiple different server groups, each including any number of servers up to, for example, n servers $12_1$-$12_n$. Servers 12 provide computation and storage facilities for applications and data associated with customers 11 and may be physical (bare-metal) servers, virtual machines running on physical servers, virtualized containers running on physical servers, or combinations thereof.

In the example of FIG. 1, each of servers 12 is coupled to switch fabric 14 by an access node 17 for processing streams of information, such as network packets or storage packets. In example implementations, access nodes 17 may be configurable to operate in a standalone network appliance having one or more access nodes. For example, access nodes 17 may be arranged into multiple different access node groups 19, each including any number of access nodes up to, for example, x access nodes 17$_1$-17$_x$. In other examples, each access node may be implemented as a component (e.g., electronic chip) within a device, such as a compute node, application server, storage server, and may be deployed on a motherboard of the device or within a removable card, such as a storage and/or network interface card.

In general, each access node group 19 may be configured to operate as a high-performance I/O hub designed to aggregate and process network and/or storage I/O for multiple servers 12. As described above, the set of access nodes 17 within each of the access node groups 19 provide highly-programmable, specialized I/O processing circuits for handling networking and communications operations on behalf of servers 12. In addition, in some examples, each of access node groups 19 may include storage devices 27, such as solid state drives (SSDs) and/or hard disk drives (HDDs), configured to provide network accessible storage for use by applications executing on the servers 12. In some examples, one or more of the SSDs may comprise non-volatile memory (NVM) or flash memory. Each access node group 19, including its set of access nodes 17 and storage devices 27, and the set of servers 12 supported by the access nodes 17 of that access node group 19 may be referred to herein as a network storage compute unit.

As further described herein, in one example, each access node 17 is a highly programmable I/O processor specially designed for offloading certain functions from servers 12. In one example, each access node 17 includes a number of internal processor clusters, each including two or more processing cores and equipped with hardware engines that offload cryptographic functions, compression and regular expression (RegEx) processing, data storage functions including deduplication and erasure coding, and networking operations. In this way, each access node 17 includes components for fully implementing and processing network and storage stacks on behalf of one or more servers 12. In addition, access nodes 17 may be programmatically configured to serve as a security gateway for its respective servers 12, freeing up the processors of the servers to dedicate resources to application workloads. In some example implementations, each access node 17 may be viewed as a network interface subsystem that implements full offload of the handling of data packets (with zero copy in server memory) and storage acceleration for the attached server systems. In one example, each access node 17 may be implemented as one or more application-specific integrated circuit (ASIC) or other hardware and software components, each supporting a subset of the servers. In accordance with the techniques of this disclosure, any or all of access nodes 17 may include a data compression accelerator unit. That is, one or more computing devices may include an access node including one or more data compression accelerator units, according to the techniques of this disclosure.

The data compression accelerator unit of the access node, according to the techniques of this disclosure, may be configured to process payloads of packets during various services as the packets are exchanged by access nodes 17, e.g., between access nodes 17 via switch fabric 14 and/or between servers 12. That is, as packets are exchanged between the devices, either for networking or for data storage and retrieval, the access node may perform data compression on payloads of the packet. For example, the access node may use one or more data compression accelerator units to perform static dictionary-based and dynamic history-based compression followed by entropy encoding. According to the techniques of this disclosure, each of the hardware-based data compression accelerator units may include a pipeline for performing the static dictionary-based and dynamic history-based compression (i.e., string search and replacement) more efficiently than is possible in software running on a general purpose processor.

In the example of FIG. 1, each access node 17 provides connectivity to switch fabric 14 for a different group of servers 12 and may be assigned respective IP addresses and provide routing operations for the servers 12 coupled thereto. Access nodes 17 may interface with and utilize switch fabric 14 so as to provide full mesh (any-to-any) interconnectivity such that any of servers 12 may communicate packet data for a given packet flow to any other of the servers using any of a number of parallel data paths within the data center 10. In addition, access nodes 17 described herein may provide additional services, such as storage (e.g., integration of solid-state storage devices), security (e.g., encryption), acceleration (e.g., compression), I/O offloading, and the like. In some examples, one or more of access nodes 17 may include storage devices, such as high-speed solid-state drives or rotating hard drives, configured to provide network accessible storage for use by applications executing on the servers. More details on the data center network architecture and interconnected access nodes illustrated in FIG. 1 are available in U.S. patent application Ser. No. 15/939,227, filed Mar. 28, 2018, entitled "Non-Blocking Any-to-Any Data Center Network with Packet Spraying Over Multiple Alternate Data Paths," the entire content of which is incorporated herein by reference.

Two example architectures of access nodes 17 are described below with respect to FIGS. 2, 3, and 4. With respect to either example, the architecture of each access node 17 comprises a multiple core processor system that represents a high performance, hyper-converged network, storage, and data processor and input/output hub. The architecture of each access node 17 is optimized for high performance and high efficiency stream processing. More details on access nodes, including their operation and example architectures, are available in U.S. patent application Ser. No. 16/031,676, filed Jul. 10, 2018, entitled "Access Node for Data Centers," the entire content of which is incorporated herein by reference.

In this disclosure, access nodes may also be referred to as data processing units (DPUs), or devices including DPUs. Additional example details of various example DPUs are described in U.S. patent application Ser. No. 16/031,921, filed Jul. 10, 2018, entitled "Data Processing Unit for Compute Nodes and Storage Nodes," and U.S. patent application Ser. No. 16/031,945, filed Jul. 10, 2018, entitled "Data Processing Unit for Stream Processing," the entire content of each of which is incorporated herein by reference.

A stream is defined as an ordered, unidirectional sequence of computational objects that can be of unbounded or undetermined length. In a simple example, a stream originates in a producer and terminates at a consumer, is operated on sequentially, and is flow-controlled. In some examples, a stream can be defined as a sequence of stream fragments, each representing a portion of data communicated by a stream. In one example, a stream fragment may include a memory block contiguously addressable in physical address space, an offset into that block, and a valid length. Streams can be discrete, such as a sequence of packets received from a network, or continuous, such as a stream of bytes read from a storage device. A stream of one type may be transformed into another type as a result of processing. Independent of the stream type, stream manipulation requires efficient fragment manipulation. An application executing on one of access nodes 17 may operate on a stream in three broad ways: the first is protocol processing, which consists of operating on control information or headers within the stream; the second is payload processing, which involves significant accessing of the data within the stream; and third is some combination of both control and data access.

Stream processing is a specialized type of conventional general-purpose processing supporting specialized limitations with regard to both access and directionality. Processing typically only accesses a limited portion of the stream at any time, called a "window," within which it may perform random accesses. Objects outside of the window are not accessible through a streaming interface. In contrast, general purpose processing views the whole memory as randomly accessible at any time. In addition, stream processing generally progresses in one direction, called the forward direction. These characteristics make stream processing amenable to pipelining, as different processors within one of access nodes 17 can safely access different windows within the stream.

As described herein, data processing units of access nodes 17 may process stream information by managing "work units." In general, a work unit (WU) is a container that is associated with a stream state and used to describe (i.e. point to) data within a stream (stored in memory) along with any associated meta-data and operations to be performed on the data. In the example of FIG. 1, streams of data units may dynamically originate within a peripheral unit of one of access nodes 17 (e.g. injected by a networking unit, a host unit, or a solid state drive interface), or within a processor of the one of access nodes 17, in association with one or more streams of data, and terminate at another peripheral unit or another processor of the one of access nodes 17. Each work unit maintained by a data processing unit is associated with an amount of work that is relevant to the entity executing the work unit for processing a respective portion of a stream.

Stream processing is typically initiated as a result of receiving one or more data units associated with respective portions of the stream and constructing and managing work units for processing respective portions of the data stream. In protocol processing, a portion would be a single buffer (e.g. packet), for example. Within access nodes 17, work units may be executed by processor cores, hardware blocks, I/O interfaces, or other computational processing units. For instance, a processor core of an access node 17 executes a work unit by accessing the respective portion of the stream from memory and performing one or more computations in accordance with the work unit. A component of the one of access nodes 17 may receive, execute or generate work units. A succession of work units may define how the access node processes a flow, and smaller flows may be stitched together to form larger flows.

For purposes of example, DPUs within each access node 17 may execute an operating system, such as a general-purpose operating system or a special-purpose operating system, that provides an execution environment for data plane software for data processing. Moreover, each DPU may be configured to utilize a work unit (WU) stack data structure (referred to as a 'WU stack' in a multiple core processor system. As described herein, the WU stack data structure may provide certain technical benefits, such as helping manage an event driven, run-to-completion programming model of an operating system executed by the multiple core processor system. The WU stack, in a basic form, may be viewed as a stack of continuation WUs used in addition to (not instead of) a program stack maintained by the operating system as an efficient means of enabling program execution to dynamically move between cores of the access node while performing high-rate stream processing. As described below, a WU data structure is a building block in the WU stack and can readily be used to compose a processing pipeline and services execution in a multiple core processor system. The WU stack structure carries state, memory, and other information in auxiliary variables external to the program stack for any given processor core. In some implementations, the WU stack may also provide an exception model for handling abnormal events and a 'success bypass' to shortcut a long series of operations. Further, the WU stack may be used as an arbitrary flow execution model for any combination of pipelined or parallel processing.

As described herein, access nodes 17 may process WUs through a plurality of processor cores arranged as processing pipelines within access nodes 17, and such processing cores may employ techniques to encourage efficient processing of such work units and high utilization of processing resources. For instance, a processing core (or a processing unit within a core) may, in connection with processing a series of work units, access data and cache the data into a plurality of segments of a level 1 cache associated with the processing core. In some examples, a processing core may process a work unit and cache data from non-coherent memory in a segment of the level 1 cache. The processing core may also concurrently prefetch data associated with a work unit expected to be processed in the future into another segment of the level 1 cache associated with the processing core. By prefetching the data associated with the future work unit in advance of the work unit being dequeued from a work unit queue for execution by the core, the processing core may be able to efficiently and quickly process a work unit once the work unit is dequeued and execution of the work unit is to commence by the processing core. More details on work units and stream processing by data processing units of access nodes are available in U.S. Provisional Patent Application No. 62/589,427, filed Nov. 21, 2017, entitled "Work Unit Stack Data Structures in Multiple Core Processor System," and U.S. patent application Ser. No. 15/949,692, filed Apr. 10, 2018, entitled "Efficient Work Unit Processing in a Multicore System," the entire content of each of which is incorporated herein by reference.

As described herein, the data processing unit for access nodes 17 includes one or more specialized hardware-based accelerators configured to perform acceleration for various data processing functions, thereby offloading tasks from the processing units when processing work units. That is, each accelerator is programmable by the processing cores, and one or more accelerators may be logically chained together to operate on stream data units, such as by providing cryptographic functions, compression and regular expression (RegEx) processing, data storage functions and networking operations.

This disclosure describes a hardware-based programmable data compression accelerator of a data processing unit that includes a pipeline for performing static dictionary-based and dynamic history-based compression. The data compression accelerator comprises computer hardware used by the data processing unit to perform data compression functions more efficiently than is possible in software running on a general purpose processor. The disclosed static dictionary-based and dynamic history-based compression pipeline, referred to herein as a "search block," is configured to perform string search and replacement functions to compress an input data stream. In some examples, the search block performs a first stage of a two-stage compression process implemented by the data compression accelerator. The second stage of the compression process includes application of entropy coding, such as by using either a Huffman coding block or a Range coding block, as examples.

The search block of the hardware-based accelerator replaces a string of bytes in the input data stream with a reference to either a previous occurrence of the same string of bytes stored in a dynamic history of the input data stream or a common word of a given length stored in a static dictionary to achieve compression. To accomplish this, in example implementations, the search block includes hardware sub-blocks referred to as a hash block, a match block, and a path block. The hash block is configured to prepare a 'history key' at a current byte position in the input data stream by selecting 'N' number of bytes starting with the current byte position and use the key to calculate a hash index into a history address hash table. The hash block uses the hash index to access a bucket of the history address hash table that contains history addresses of previous occurrences of byte strings stored in a history buffer. The hash block is also configured to a prepare a 'dictionary key' at the current byte position and use truncated versions of the key to calculate multiple hash indices in parallel as static dictionary addresses of common words having different words lengths stored in the static dictionary. The hash block then sends the history addresses of the previous occurrences to the match block and records the current byte position address into the same bucket in the history address hash table. The hash block also sends the dictionary addresses of the common words to the match block.

The match block is configured to determine whether string matches have occurred by comparing the byte string beginning at the current byte position in the input data stream to the previous occurrences of byte strings stored in a history buffer at the history addresses received from the hash block and to the common words having the different words lengths stored in the static dictionary at the dictionary addresses received from the hash block. In this way, for the current byte position, the match block may determine matches from both the dynamic history and the static dictionary, and send the matches to the path block. The path block is configured to select the longest and closest match at the current byte position and merge consecutive matches to form a longer match. The path block may also be configured to support lazy match in which the path block determines whether it is better to output a length-distance pair to represent a match beginning at the current byte position or to output a literal for the current byte position based on matches at other byte positions within a configurable window.

The search block may support single and multi-thread processing, and multiple levels of effort with the level of compression increasing with the effort level. In accordance with the techniques of this disclosure, in order to achieve high-compression, the search block may operate at a high level of effort that supports a single thread and use of both a dynamic history of the input data stream and a static dictionary of common words. The static dictionary may be especially useful in achieving high-compression in cases where the input data stream used to build the dynamic history is not large enough for self-referential strings to be advantageous or otherwise provide a sufficient amount of history for byte string matching. The pipeline of the search block is described in more detail with respect to FIG. 7B. The hash block is described in more detail with respect to FIG. 8. The match block is described in more detail with respect to FIG. 9. The path block is described in more detail with respect to FIG. 12.

Figure 2:
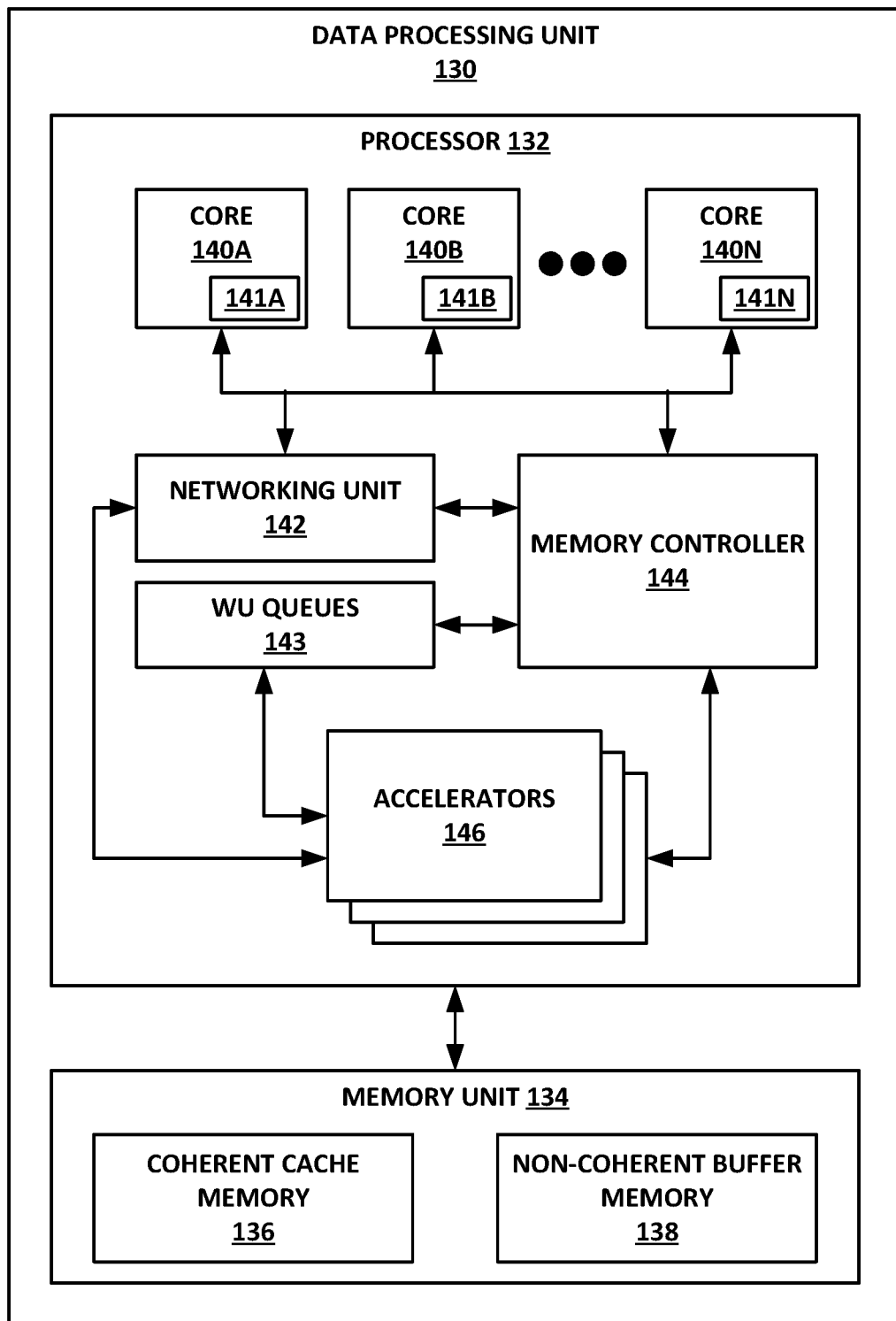
FIG. 2 is a block diagram illustrating an example data processing unit including two or more processing cores, in accordance with the techniques of this disclosure.

FIG. 2 is a block diagram illustrating an example data processing unit (DPU) 130 including two or more processing cores, in accordance with the techniques of this disclosure. DPU 130 generally represents a hardware chip implemented in digital logic circuitry and may be used in any computing or network device. DPU 130 may operate substantially similar to and generally represent any of access nodes 17 of FIG. 1. Thus, DPU 130 may be communicatively coupled to one or more network devices, server devices (e.g., servers 12), random access memory, storage media (e.g., solid state drives (SSDs)), a data center fabric (e.g., switch fabric 14), or the like, e.g., via PCI-e, Ethernet (wired or wireless), or other such communication media. Moreover, DPU 130 may be implemented as one or more application-specific integrated circuit (ASIC), may be configurable to operate as a component of a network appliance or may be integrated with other DPUs within a device.

In the illustrated example of FIG. 2, DPU 130 includes a multi-core processor 132 having a plurality of programmable processing cores 140A-140N ("cores 140") coupled to an on-chip memory unit 134. Each of cores 140 includes a level 1 cache 141 (level 1 caches 141a, 141b, and 141n are associated with cores 140a, 140b, and 140n, respectively).

Memory unit 134 may include two types of memory or memory devices, namely coherent cache memory 136 and non-coherent buffer memory 138. Processor 132 also includes a networking unit 142, work unit (WU) queues 143, a memory controller 144, and accelerators 146. As illustrated in FIG. 2, each of cores 140, networking unit 142, WU queues 143, memory controller 144, memory unit 134, and accelerators 146 are communicatively coupled to each other. In some examples, processor 132 of DPU 130 further includes one or more accelerators (not shown) configured to perform acceleration for various data processing functions, such as look-ups, matrix multiplication, cryptography, compression, regular expressions, or the like.

In this example, DPU 130 represents a high performance, hyper-converged network, storage, and data processor and input/output hub. For example, networking unit 142 may be configured to receive one or more data packets from and transmit one or more data packets to one or more external devices, e.g., network devices. Networking unit 142 may perform network interface card functionality, packet switching, and the like, and may use large forwarding tables and offer programmability. Networking unit 142 may expose Ethernet ports for connectivity to a network, such as switch fabric 14 of FIG. 1. DPU 130 may also include one or more interfaces for connectivity to host devices (e.g., servers) and data storage devices, e.g., solid state drives (SSDs) via PCIe lanes. DPU 130 may further include one or more high bandwidth interfaces for connectivity to off-chip external memory.

Processor 132 further includes accelerators 146 configured to perform acceleration for various data processing functions, such as look-ups, matrix multiplication, cryptography, compression, regular expressions, or the like. For example, accelerators 146 may comprise hardware implementations of look-up engines, matrix multipliers, cryptographic engines, compression engines, or the like. In accordance with the techniques of this disclosure, at least one of accelerators 146 represents a hardware implementation of a data compression engine. In particular, according to the techniques of this disclosure, accelerators 146 include at least one hardware-based data compression accelerator that includes a pipeline for performing static dictionary-based and dynamic history-based compression (i.e., string search and replacement functions) on an input data stream, as discussed in greater detail below.

Memory controller 144 may control access to on-chip memory unit 134 by cores 140, networking unit 142, and any number of external devices, e.g., network devices, servers, external storage devices, or the like. Memory controller 144 may be configured to perform a number of operations to perform memory management in accordance with the present disclosure. For example, memory controller 144 may be capable of mapping accesses from one of the cores 140 to either of coherent cache memory 136 or non-coherent buffer memory 138. More details on the bifurcated memory system included in the DPU are available in U.S. patent application Ser. No. 15/949,892, filed Apr. 10, 2018, entitled "Relay Consistent Memory Management in a Multiple Processor System," the entire content of which is incorporated herein by reference.

Cores 140 may comprise one or more MIPS (microprocessors without interlocked pipeline stage) cores, ARM (advanced RISC (reduced instruction set computing) machine) cores, PowerPC (performance optimization with enhanced RISC-performance computing) cores, RISC-V (RISC-Five) cores, or CISC (complex instruction set computing) or x86 cores. Each of cores 140 may be programmed to process one or more events or activities related to a given data packet such as, for example, a networking packet or a storage packet. Each of cores 140 may be programmable using a high-level programming language, e.g., C, C++, or the like.

Each of level 1 caches 141 may include a plurality of cache lines logically or physically divided into cache segments. Each of level 1 caches 141 may be controlled by a load/store unit also included within the core. The load/store unit may include logic for loading data into cache segments and/or cache lines from non-coherent buffer memory 138 and/or memory external to DPU 130. The load/store unit may also include logic for flushing cache segments and/or cache lines to non-coherent buffer memory 138 and/or memory external to DPU 130. In some examples, the load/store unit may be configured to prefetch data from main memory during or after a cache segment or cache line is flushed.

As described herein, processor cores 140 may be arranged as processing pipelines, and such processing cores may employ techniques to encourage efficient processing of such work units and high utilization of processing resources. For instance, any of processing cores 140 (or a processing unit within a core) may, in connection with processing a series of work units retrieved from WU queues 143, access data and cache the data into a plurality of segments of level 1 cache 141 associated with the processing core. In some examples, a processing core 140 may process a work unit and cache data from non-coherent memory 138 in a segment of the level 1 cache 141. As described herein, concurrent with execution of work units by cores 140, a load store unit of memory controller 144 may be configured to prefetch, from non-coherent memory 138, data associated with work units within WU queues 143 that are expected to be processed in the future, e.g., the WUs now at the top of the WU queues and next in line to be processed. For each core 140, the load store unit of memory controller 144 may store the prefetched data associated with the WU to be processed by the core into a standby segment of the level 1 cache 141 associated with the processing core 140.

In some examples, the plurality of cores 140 executes instructions for processing a plurality of events related to each data packet of one or more data packets, received by networking unit 142, in a sequential manner in accordance with one or more work units associated with the data packets. As described above, work units are sets of data exchanged between cores 140 and networking unit 142 where each work unit may represent one or more of the events related to a given data packet.

As one example use case, stream processing may be divided into work units executed at a number of intermediate processors between source and destination. Depending on the amount of work to be performed at each stage, the number and type of intermediate processors that are involved may vary. In processing a plurality of events related to each data packet, a first one of the plurality of cores 140, e.g., core 140A may process a first event of the plurality of events. Moreover, first core 140A may provide to a second one of plurality of cores 140, e.g., core 140B a first work unit of the one or more work units. Furthermore, second core 140B may process a second event of the plurality of events in response to receiving the first work unit from first core 140B.

As another example use case, transfer of ownership of a memory buffer between processing cores may be mediated by a work unit message delivered to one or more of processing cores 140. For example, the work unit message may be a four-word message including a pointer to a memory buffer. The first word may be a header containing information necessary for message delivery and information used for work unit execution, such as a pointer to a function for execution by a specified one of processing cores 140. Other words in the work unit message may contain parameters to be passed to the function call, such as pointers to data in memory, parameter values, or other information used in executing the work unit.

In one example, receiving a work unit is signaled by receiving a message in a work unit receive queue (e.g., one of WU queues 143). The one of WU queues 143 is associated with a processing element, such as one of cores 140, and is addressable in the header of the work unit message. One of cores 140 may generate a work unit message by executing stored instructions to addresses mapped to a work unit transmit queue (e.g., another one of WU queues 143). The stored instructions write the contents of the message to the queue. The release of a work unit message may be interlocked with (gated by) flushing of the core's dirty cache data and in some examples, prefetching into the cache of data associated with another work unit for future processing.

Figure 3:
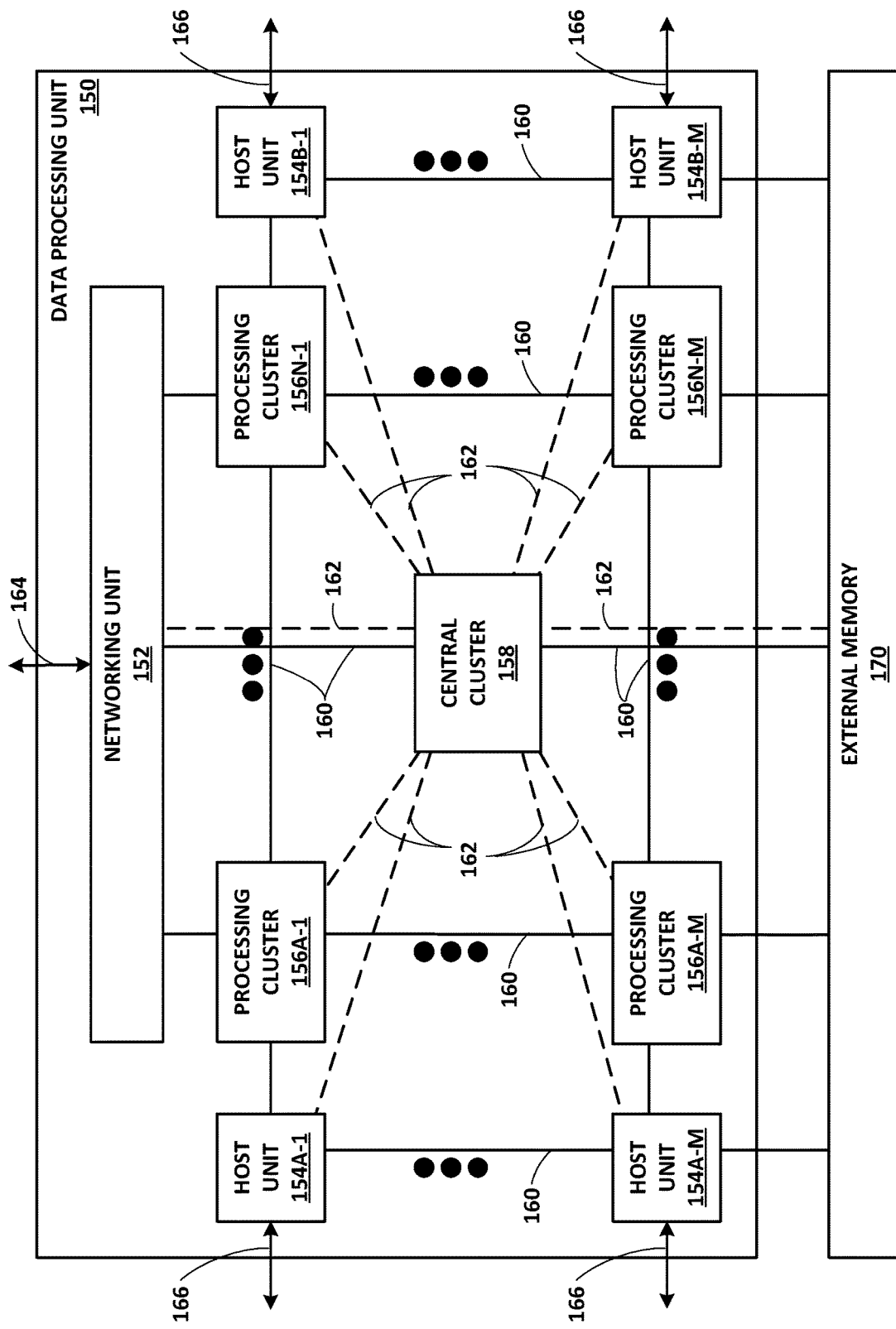
FIG. 3 is a block diagram illustrating another example data processing unit including two or more processing clusters, in accordance with the techniques of this disclosure.

FIG. 3 is a block diagram illustrating another example of a DPU 150 including two or more processing clusters, in accordance with the techniques of this disclosure. DPU 150 may operate substantially similar to any of the access nodes 17 of FIG. 1. Thus, DPU 150 may be communicatively coupled to a data center fabric (e.g., switch fabric 14), one or more server devices (e.g., servers 12), storage media (e.g., SSDs), one or more network devices, random access memory, or the like, e.g., via PCI-e, Ethernet (wired or wireless), or other such communication media in order to interconnect each of these various elements. DPU 150 generally represents a hardware chip implemented in digital logic circuitry. As various examples, DPU 150 may be provided as an integrated circuit mounted on a motherboard of a computing, networking and/or storage device or installed on a card connected to the motherboard of the device.

In general, DPU 150 represents a high performance, hyper-converged network, storage, and data processor and input/output hub. As illustrated in FIG. 3, DPU 150 includes networking unit 152, processing clusters 156A-1 to 156N-M (processing clusters 156), host units 154A-1 to 154B-M (host units 154), and central cluster 158, and is coupled to external memory 170. Each of host units 154, processing clusters 156, central cluster 158, and networking unit 152 may include a plurality of processing cores, e.g., MIPS cores, ARM cores, PowerPC cores, RISC-V cores, or CISC or x86 cores. External memory 170 may comprise random access memory (RAM) or dynamic random access memory (DRAM).

As shown in FIG. 3, host units 154, processing clusters 156, central cluster 158, networking unit 152, and external memory 170 are communicatively interconnected via one or more specialized network-on-chip fabrics. A set of direct links 162 (represented as dashed lines in FIG. 3) forms a signaling network fabric that directly connects central cluster 158 to each of the other components of DPU 150, that is, host units 154, processing clusters 156, networking unit 152, and external memory 170. A set of grid links 160 (represented as solid lines in FIG. 3) forms a data network fabric that connects neighboring components (including host units 154, processing clusters 156, networking unit 152, and external memory 170) to each other in a two-dimensional grid.

Networking unit 152 has Ethernet interfaces 164 to connect to the switch fabric, and interfaces to the data network formed by grid links 160 and the signaling network formed by direct links 162. Networking unit 152 provides a Layer 3 (i.e., OSI networking model Layer 3) switch forwarding path, as well as network interface card (NIC) assistance. One or more hardware direct memory access (DMA) engine instances (not shown) may be attached to the data network ports of networking unit 152, which are coupled to respective grid links 160. The DMA engines of networking unit 152 are configured to fetch packet data for transmission. The packet data may be in on-chip or off-chip buffer memory (e.g., within buffer memory of one of processing clusters 156 or external memory 170), or in host memory.

Host units 154 each have PCI-e interfaces 166 to connect to servers and/or storage devices, such as SSD devices. This allows DPU 150 to operate as an endpoint or as a root. For example, DPU 150 may connect to a host system (e.g., a server) as an endpoint device, and DPU 150 may connect as a root to endpoint devices (e.g., SSD devices). Each of host units 154 may also include a respective hardware DMA engine (not shown). Each DMA engine is configured to fetch data and buffer descriptors from host memory, and to deliver data and completions to host memory.

DPU 150 provides optimizations for stream processing. DPU 150 executes an operating system that facilitates run-to-completion processing, which may eliminate interrupts, thread scheduling, cache thrashing, and associated costs. For example, an operating system may run on one or more of processing clusters 156. Central cluster 158 may be configured differently from processing clusters 156, which may be referred to as stream processing clusters. In one example, central cluster 158 executes the operating system kernel (e.g., Linux kernel) as a control plane. Processing clusters 156 may function in run-to-completion thread mode of a data plane software stack of the operating system. That is, processing clusters 156 may operate in a tight loop fed by work unit queues associated with each processing core in a cooperative multi-tasking fashion.

DPU 150 operates on work units (WUs) that associate a buffer with an instruction stream to reduce dispatching overhead and allow processing by reference to minimize data movement and copy. The stream-processing model may structure access by multiple processors (e.g., processing clusters 156) to the same data and resources, avoid simultaneous sharing, and therefore, reduce contention. A processor may relinquish control of data referenced by a work unit as the work unit is passed to the next processor in line. Central cluster 158 may include a central dispatch unit responsible for work unit queuing and flow control, work unit and completion notification dispatch, and load balancing and processor selection from among processing cores of processing clusters 156 and/or central cluster 158.

As described above, work units are sets of data exchanged between processing clusters 156, networking unit 152, host units 154, central cluster 158, and external memory 170. Each work unit may be represented by a fixed length data structure, or message, including an action value and one or more arguments. In one example, a work unit message includes four words, a first word having a value representing an action value and three additional words each representing an argument. The action value may be considered a work unit message header containing information necessary for message delivery and information used for work unit execution, such as a work unit handler identifier, and source and destination identifiers of the work unit. The other arguments of the work unit data structure may include a frame argument having a value acting as a pointer to a continuation work unit to invoke a subsequent work unit handler, a flow argument having a value acting as a pointer to state that is relevant to the work unit handler, and a packet argument having a value acting as a packet pointer for packet and/or block processing handlers.

In some examples, one or more processing cores of processing clusters 180 may be configured to execute program instructions using a work unit (WU) stack. In general, a work unit (WU) stack is a data structure to help manage event driven, run-to-completion programming model of an operating system typically executed by processing clusters 156 of DPU 150, as further described in U.S. Patent Application Ser. No. 62/589,427, filed Nov. 21, 2017, the entire content of which is incorporated herein by reference.

As described herein, in some example implementations, load store units within processing clusters 156 may, concurrent with execution of work units by cores within the processing clusters, identify work units that are enqueued in WU queues for future processing by the cores. In some examples, WU queues storing work units enqueued for processing by the cores within processing clusters 156 may be maintained as hardware queues centrally managed by central cluster 158. In such examples, load store units may interact with central cluster 158 to identify future work units to be executed by the cores within the processing clusters. The load store units prefetch, from the non-coherent memory portion of external memory 170, data associated with the future work units. For each core within processing clusters 156, the load store units of the core may store the prefetched data associated with the WU to be processed by the core into a standby segment of the level 1 cache associated with the processing core.

Figure 4:
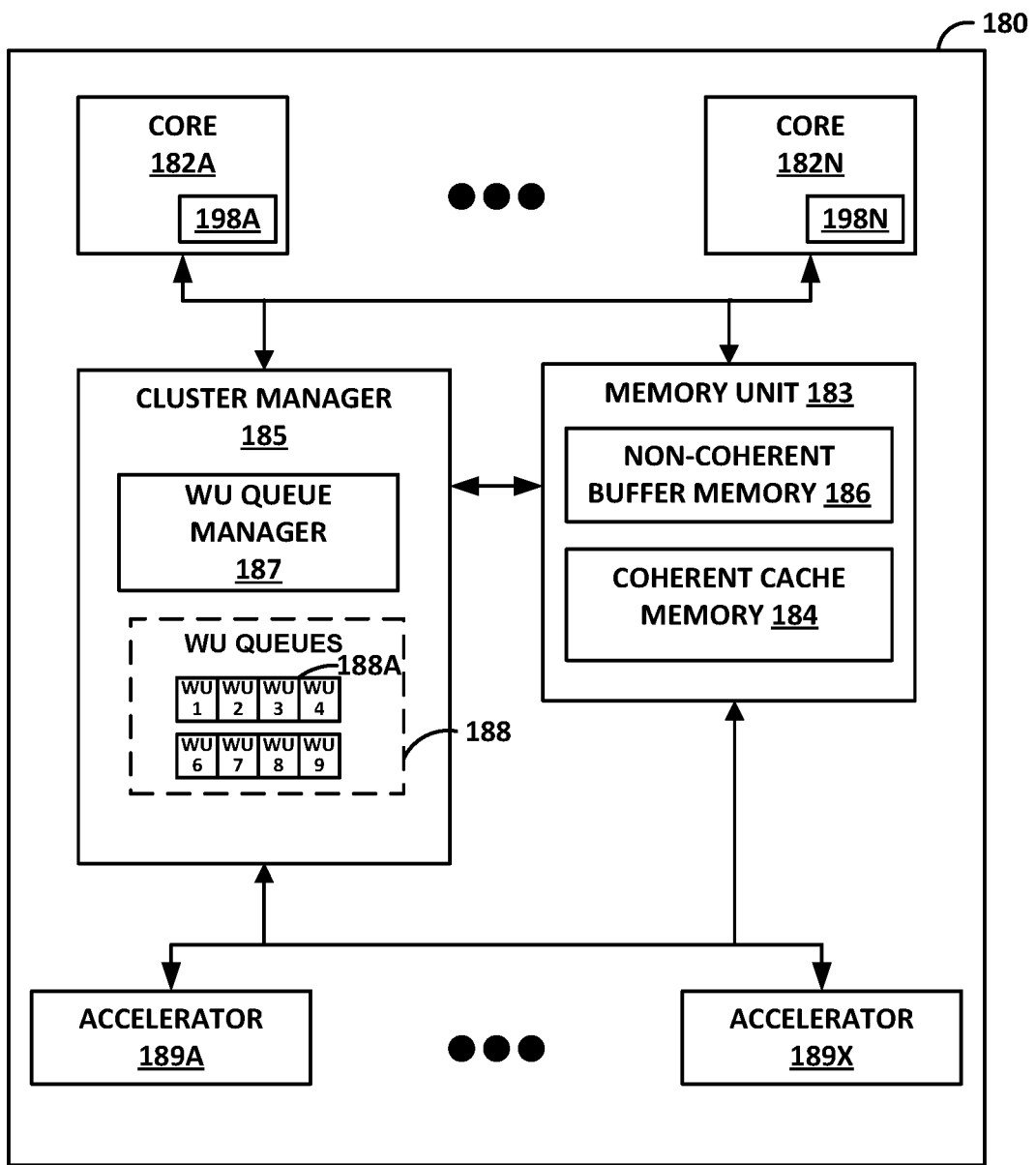
FIG. 4 is a block diagram illustrating an example processing cluster including two or more processing cores.

FIG. 4 is a block diagram illustrating an example processing cluster 180 including two or more processing cores 182A-182N. Each of processing clusters 156 of DPU 150 of FIG. 3 may be configured in a manner substantially similar to that shown in FIG. 4. In the example of FIG. 4, processing cluster 180 includes cores 182A-182N ("cores 182"), a memory unit 183 including a coherent cache memory 184 and a non-coherent buffer memory 186, a cluster manager 185 including WU queue manager 187 for maintaining (e.g., within hardware registers of processing cluster 180) and manipulating WU queues 188, and accelerators 189A-189X ("accelerators 189"). Each of cores 182 includes L1 buffer cache 198 (i.e., core 182 includes L1 buffer cache 198A and in general, core 182N includes L1 buffer cache 198N). In some examples, cluster manager 185 is alternatively located within central cluster 158, and/or WU queues 188 are alternatively maintained within central cluster 158 (e.g., within hardware registers of central cluster 158).

An access node or DPU (such as access nodes 17 of FIG. 1, DPU 130 of FIG. 2, or DPU 150 of FIG. 3) may support two distinct memory systems: a coherent memory system and a non-coherent buffer memory system. In the example of FIG. 4, coherent cache memory 184 represents part of the coherent memory system while non-coherent buffer memory 186 represents part of the non-coherent buffer memory system. Cores 182 may represent the processing cores discussed with respect to DPU 150 of FIG. 3. Cores 182 may share non-coherent buffer memory 186. As one example, cores 182 may use non-coherent buffer memory 186 for sharing streaming data, such as network packets.

In general, accelerators 189 perform acceleration for various data processing functions, such as table lookups, matrix multiplication, cryptography, compression, regular expressions, or the like. That is, accelerators 189 may comprise hardware implementations of lookup engines, matrix multipliers, cryptographic engines, compression engines, regular expression interpreters, or the like. For example, accelerators 189 may include a lookup engine that performs hash table lookups in hardware to provide a high lookup rate. The lookup engine may be invoked through work units from external interfaces and virtual processors of cores 182, and generates lookup notifications through work units. Accelerators 189 may also include one or more cryptographic units to support various cryptographic processes. Accelerators 189 may also include one or more compression units to perform compression and/or decompression.

An example process by which a processing cluster 180 processes a work unit is described here. Initially, cluster manager 185 of processing cluster 180 may queue a work unit (WU) in a hardware queue of WU queues 188. When cluster manager 185 "pops" the work unit from the hardware queue of WU queues 188, cluster manager 185 delivers the work unit to one of accelerators 189, e.g., a lookup engine. The accelerator 189 to which the work unit is delivered processes the work unit and determines that the work unit is to be delivered to one of cores 182 (in particular, core 182A, in this example) of processing cluster 180. Thus, the one of accelerators 189 forwards the work unit to a local switch of the signaling network on the DPU, which forwards the work unit to be queued in a virtual processor queue of WU queues 188.

As noted above, in accordance with the techniques of this disclosure, one or more of accelerators 189 may be configured to perform data compression. A hardware-based data compression accelerator of accelerators 189, in accordance with the techniques of this disclosure, may include a pipeline for performing static dictionary-based and dynamic history-based compression. The disclosed static dictionary-based and dynamic history-based compression pipeline is configured to perform string search and replacement functions to compress an input data stream, as indicated by one or more work units. That is, the static dictionary-based and dynamic history-based compression pipeline scans the input data stream for matching byte strings based on previously processed data of the input data stream within a local history buffer and based on common words within a static dictionary, and replaces the matching byte strings with length-distance pairs that point to either the previous occurrences of the byte strings in the dynamic history or the common words in the static dictionary, as discussed in greater detail below.

After cluster manager 185 pops the work unit from the virtual processor queue of WU queues 188, cluster manager 185 delivers the work unit via a core interface to core 182A, in this example. An interface unit of core 182A then delivers the work unit to one of the virtual processors of core 182A.

Core 182A processes the work unit, which may involve accessing data, such as a network packet or storage packet, in non-coherent memory 156A and/or external memory 170. Core 182A may first look for the corresponding data in cache 198A, and in the event of a cache miss, may access the data from non-coherent memory 156A and/or external memory 170. In some examples, while processing the work unit, core 182A may store information (i.e., the network packet or data packet) associated with the work unit in an active segment of cache 198A. Further, core 182A may, while processing the work unit, prefetch data associated with a second work unit into a different, standby segment of cache 198A. When core 182A completes processing of the work unit, core 182A initiates (or causes initiation of) a cache flush for the active segment, and may also initiate prefetching of data associated with a third work unit (to be processed later) into that active segment. Core 182A (or a virtual processor within core 182A) may then swap the active segment and the standby segment so that the previous standby segment becomes the active segment for processing of the next work unit (i.e., the second work unit). Because data associated with the second work unit was prefetched into this now active segment, core 182A (or a virtual processor within core 182A) may be able to more efficiently process the second work unit. Core 182A then outputs corresponding results (possibly including one or more work unit messages) from performance of the work unit back through the interface unit of core 182A.

As described herein, in some example implementations, load store units within memory unit 183 may, concurrent with execution of work units by cores 182 within the processing cluster 180, identify work units that are enqueued in WU queues 188 for future processing by the cores. The load store units prefetch, from a non-coherent memory portion of external memory 170, data associated with the future work units and store the prefetched data associated with the WUs to be processed by the cores into a standby segment of the level 1 cache associated with the particular processing cores.

Figure 5:
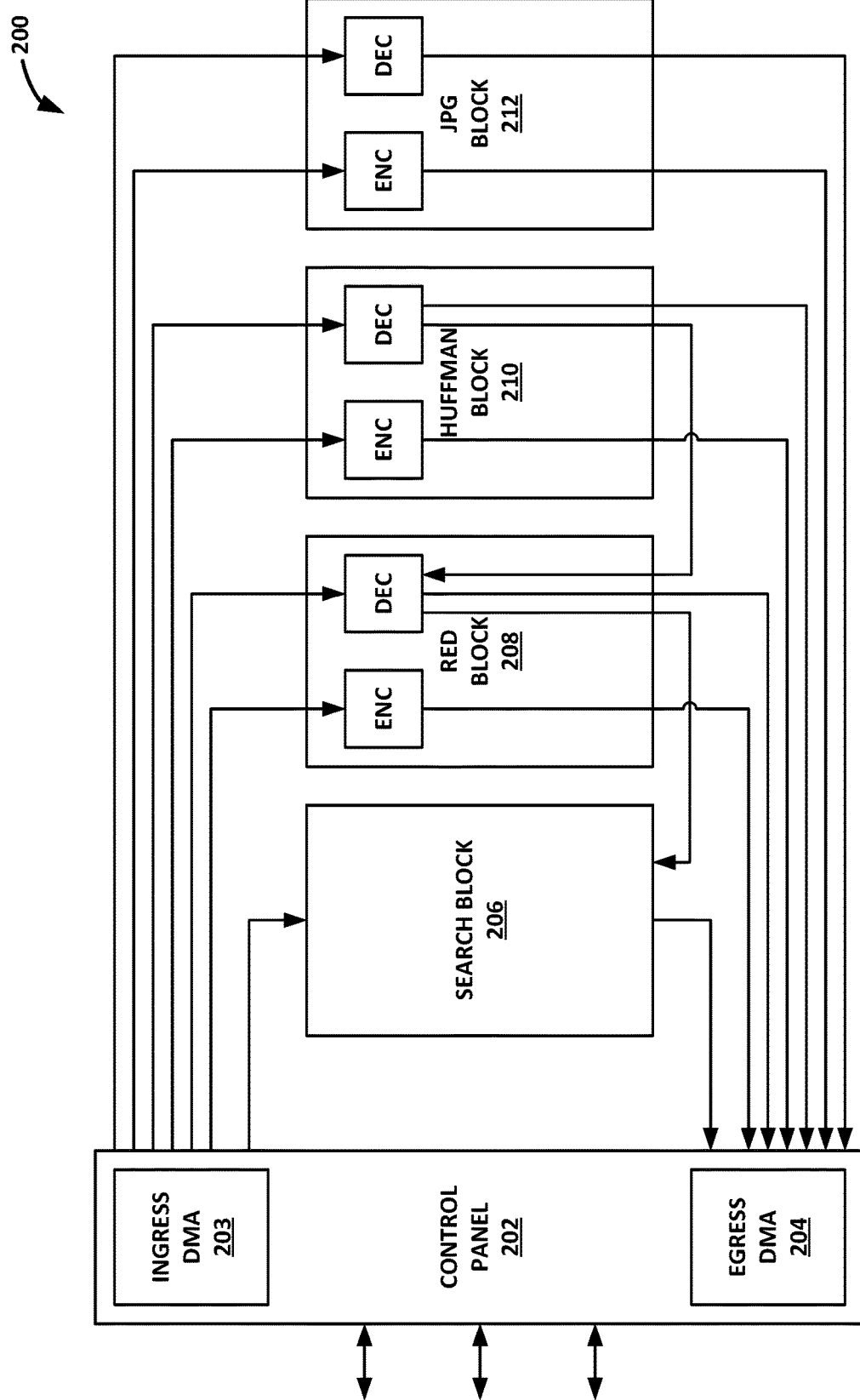
FIG. 5 is a block diagram illustrating an example data compression accelerator.

FIG. 5 is a block diagram illustrating an example data compression accelerator 200. For example, data compression accelerator 200 may be one of accelerators 146 of data processing unit 130 from FIG. 3, or one of accelerators 189 of processing cluster 180 from FIG. 4. In some examples, data compression accelerator 200 may be included in each of processing clusters 156 of data processing unit 150 from FIG. 3 for local, hardware-based execution of compression work units generated by software executing on the processing cores of the respective cluster.

Data compression accelerator 200 is configured to accelerate the computationally intensive data compression and decompression operations conventionally performed by software running on general-purpose processors. As illustrated in FIG. 5, in this example, data compression accelerator 200 includes a control panel 202, a search block 206, a range encode/decode (RED) block 208, a Huffman encode/decode block 210, and a JPG re-encode/decode block 212, each of which represent different hardware circuitry within, for example, an integrated circuit device. With these components, as described in more detail below, data compression accelerator 200 may support DEFLATE compression and decompression used by gzip and zlib, support Lempel-Ziv-Markov chain algorithm (LZMA) compression and decompression with or without static dictionary compression, and support JPG re-compression and decompression. DEFLATE compression comprises a lossless data compression algorithm that uses a combination of a history-based compression scheme performed by search block 206 and Huffman encoding performed by Huffman block 210. For example, the history-based compression scheme may comprise one of the LZ77, LZ78, LZW, LZ4, LZO, or LZS algorithms. The DEFLATE compression and decompression is described in more detail in P. Deutsch, "DEFLATE Compressed Data Format Specification version 1.3," IETF Network Working Group, RFC 1951, May 1996. LZMA compression comprises another lossless data compression algorithm that uses a combination of a history-based compression scheme with or without a static dictionary-based compression scheme performed by search block 206 and range encoding performed by RED block 208. JPG re-compression comprises lossy compression for digital images performed by JPG block 212.

Control panel (CP) 202 of data compression accelerator 200 operates as an interface to the other blocks in data compression accelerator 200, and is the only block in data compression accelerator 200 with external interfaces. CP 202 controls the mode of operation, manages WUs, and tracks resources and schedules jobs for each of the engine blocks (i.e., search block 206, RED block 208, Huffman block 210, and JPG block 212) within data compression accelerator 200. CP 202 also provides ingress DMA 203 and egress DMA 204. The engine blocks within data compression accelerator 200 work on a stream of data and there are no random accesses to external memories or to external blocks. External interfaces of CP 202 are used for receiving WUs, sending WUs, receiving payload data, sending result data, and receiving configuration data. Internal interfaces between the engine blocks within data compression accelerator 200 are mostly streaming interfaces. The internal interfaces may use credit-based flow control. For example, at the beginning of a job there may be N flow control units ('flits') of header data that describe the job.

CP 202 is responsible for controlling access to shared resources that can be used by multiple of the engine blocks within data compression accelerator 200. Any scheduling of resources local to a specific one of the engine blocks may be done locally by that engine block. For example, search block 206 and RED block 208 may share a history buffer local to search block 206. As another example, RED block 208 and Huffman block 210 may share one or more history buffers local to RED block 208. Certain WUs may depend on one or more of the shared resources. As such, CP 202 may control the resource assignment and only schedule WUs that do not conflict with the current resource assignment. The engine blocks within data compression accelerator 200 may not be able to detect or resolve shared resource conflicts themselves. In addition, several of the engine blocks within data compression accelerator 200, e.g., search block 206, RED block 208, and Huffman block 210, may have multiple threads. Some of the engine blocks, e.g., at least search block 206, may have both a single thread mode and a multi thread mode, depending on the type of job being processed.

Search block 206 may be the first stage of a two-stage compression process performed by data compression accelerator 200. For example, search block 206 may be configured to perform a dynamic history-based compression algorithm (e.g., the LZ77 algorithm or variants thereof) to search for and replace repeated occurrences of byte strings in an input data stream. Search block 206 uses a local history buffer that includes previously seen data of the input data stream as the self-referential, dynamic history for the history-based compression algorithm. Search block 206 is configured to scan the input data stream for repeated strings within a history window, and replace the repeated strings with length-distance pairs that point to previous occurrences of the strings in the history buffer. Search block 206 may also be configured to perform a static dictionary-based compression scheme to search for and replace occurrences of common words in the input data stream. Search block 206 uses a static dictionary that includes predefined common words having different word lengths for the dictionary-based compression algorithm. Search block 206 is configured to scan the input data stream and replace byte strings with length-distance pairs that point to matching common words in the static dictionary. The output of search block 206 includes one or both of literals (i.e., strings of bytes) and length-distance pairs used to replace strings of bytes. The output of search block 206 may then goes through a second stage of compression using entropy encoding, either using Huffman encoding performed by Huffman block 210 or range encoding performed by RED block 208.

The static dictionary-based and dynamic history-based decompression operation involves expanding the length-distance pairs into strings of bytes based on a static dictionary and a history buffer. For example, the static dictionary-based and dynamic history-based decompression operation may be performed by RED block 208 since the latency of the decompression operation affects the throughput of search block 206. In the case where the history buffer for the decompression operation is small (e.g., less than or equal to 32 KB) and the static dictionary is large (e.g., greater than 32 KB), RED block 208 may use a history buffer that is local to RED block 208. In the case where the history buffer for the decompression operation is large (e.g., greater than 32 KB) and the static dictionary is small (e.g., less than or equal to 32 KB), RED block 208 may use its local buffer as a cache and use the history buffer at search block 206 for up to the maximum supported history buffer size, e.g., 256 KB. When RED block 208 uses the history buffer at search block 206, search block 206 may be disabled. Therefore, the history-based encode/decode operation using a small history buffer may be full duplex, and the history-based encode/decode operation using a large history buffer is half duplex.

Following the static dictionary-based and dynamic history-based compression performed by search block 206, the encode (ENC) portion of Huffman block 210 may perform the second stage of the two-stage compression process for DEFLATE compression used by gzip and zlib. The output of search block 206 is the input to the encode portion of Huffman block 210. The encode portion of Huffman block 210 performs Huffman encoding, which is a type of entropy encoding that replaces high frequency symbols with shorter codes and low frequency symbols with longer codes. As a first step, the encode portion of Huffman block 210 gathers a frequency histogram for every symbol in a block of data, and stores the data in a buffer as the statistics are counted. As a second step, the encode portion of Huffman block 210 assigns codes based on the frequency of each symbol. In parallel with this step, the next block of data arrives in a second buffer. As a third step, the encode portion of Huffman block 210 outputs the encoding table, which also gets compressed. As a fourth step, the encode portion of Huffman block 210 outputs the encoded data. As the buffer is being drained, the next block begins filling the buffer. There are two buffers per thread. In some examples, Huffman block 210 has two threads such that there is a total of four buffers.

The decode (DEC) portion of Huffman block 210 may perform a first stage of a decompression process for DEFLATE format compressed data used by gzip and zlib. The decode portion of Huffman block 210 decodes a binary bit stream of encoded symbols and replaces them with the original symbols. The encoded symbols are of variable length, so the length of the previous symbol determines where the next symbol to be decoded begins in the bit stream. This chain of dependencies typically makes fast decoding challenging. The output of the decode portion of Huffman block 210 is a sequence of literals and/or length-distance pair symbols. The literals directly represent the original data (i.e., strings of bytes), and the length-distance pairs are pointers to previous occurrences of a string of bytes within a sliding history window. The second stage of the decompression process for DEFLATE is to expand the length-distance pairs. For DEFLATE, the symbol decode and the expansion are independent operations and, therefore, the operations may be performed by separate engine blocks. As discussed above with respect to the history-based decompression operation, the expansion may be performed by RED block 208.

RED block 208 performs range encoding and range decoding. The range encode (ENC) portion of RED block 208 is a bitstream encoder that compresses one bit at a time. The range encoding algorithm is comparable to arithmetic encoding. The range encode portion of RED block 208 uses a context memory that provides a probability of a 1 or 0 based the current context. The context memory is updated on the fly during compression and that process is precisely mirrored during decompression. In general, range encoding provides higher compression than Huffman encoding at the cost of lower throughput, larger area, and higher complexity.

Following the static dictionary-based and dynamic history-based compression performed by search block 206, the encode portion of RED block 208 may perform the second stage of the two-stage compression process for LZMA compression with or without static dictionary compression. Data compression accelerator 200 may have two modes of operation for LZMA compression. In a streaming mode, the output of search block 206 is directly sent to RED block 208 using one WU. In some cases, however, there may be a speed mismatch where search block 206 is running faster than RED block 208. To optimize this case, a second mode of operation decouples the search stage from the RED stage using a separate WU for each stage. In the second mode of operation, the intermediate results are directly stored to and accessed from an external memory via ingress DMA 203 and egress DMA 204. In the second mode of operation, RED block 208 may use multiple encoding threads to better match the throughput of search block 206.

The decode (DEC) portion of RED block 208 may perform a first stage of a decompression process for LZMA compressed data with or without static dictionary compressed data. The decode portion of RED block 208 receives the data to be decoded from ingress DMA 203 and sends the results out over egress DMA 204. Depending on the size of the history buffer used during LZMA compression, RED block 208 may use small internal history buffers, which allows for full duplex encode/decode, or RED block 208 may use a large external history buffer from search block 206, which only allows for half duplex encode/decode. Search block 206 may be disabled when RED block 208 is decoding using the large external history buffer local to search block 206.

Similar to Huffman decoding for DEFLATE, range decoding for LZMA decompression involves decoding symbols and expanding symbols that reference a history buffer. Unlike Huffman decoding, the expansion of the symbols in range decoding may affect the context used to decode the next symbol. In addition to performing range decoding for LZMA decompression with or without static dictionary decompression, the decode portion of RED block 208 also performs the second stage of Huffman decoding for DEFLATE, i.e., the length-distance pair expansion. In this case, the decode portion of RED block 208 receives the input from Huffman block 210, and generates the final result that is sent out over egress DMA 204.

JPG block 212 may losslessly re-encode jpg files into a proprietary format. Standard jpg files may be compressed in two phases, first a lossy phase and then second a lossless phase using Huffman encoding. JPG block 212 is configured to replace the lossless phase with a more advanced compression algorithm. Similar to RED block 208, JPG block 212 uses an adaptive context-based bit-wise encoder, but it has been specifically optimized for image data. JPG block 212 performs compression and decompression of image data independently from the other engine blocks within data compression accelerator 200 and is only in communication with CP 202.

Figure 6B:
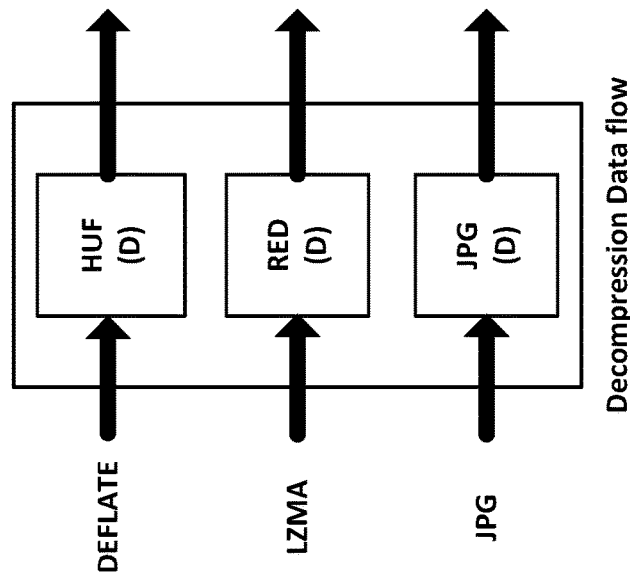
FIGS. 6A and 6B are conceptual diagrams illustrating example data flows through engine blocks within the data compression accelerator of FIG. 5.
Figure 6A:
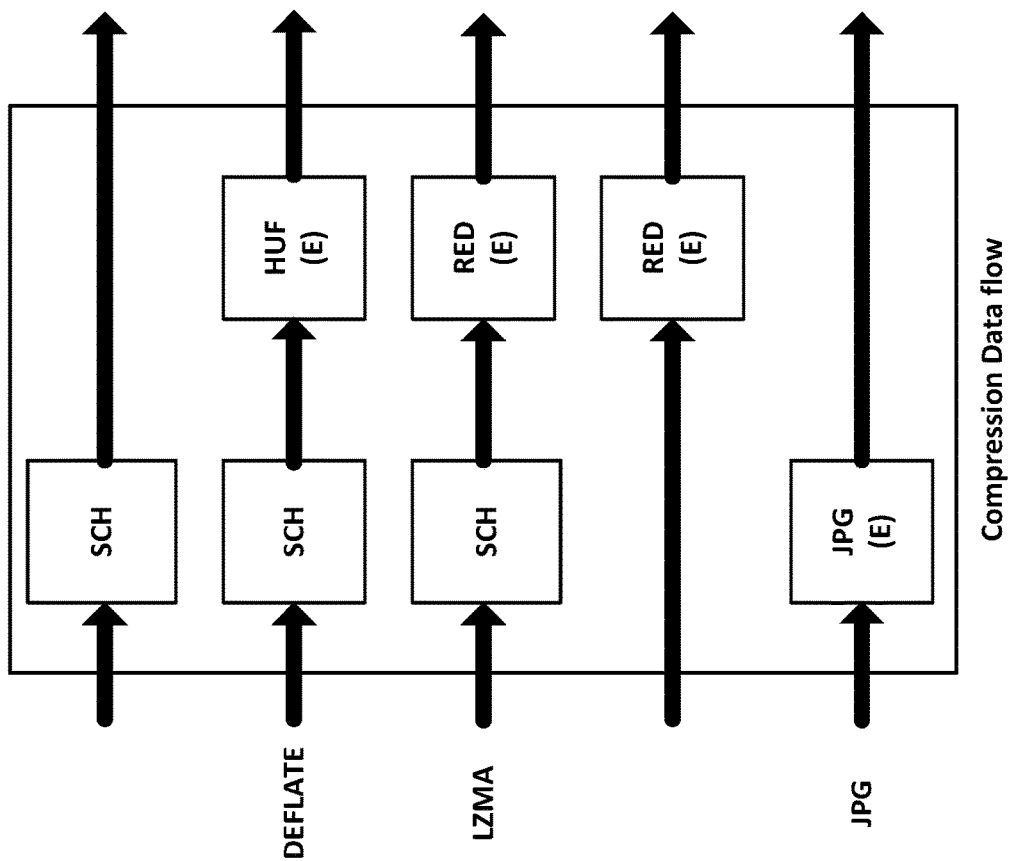

FIGS. 6A and 6B are conceptual diagrams illustrating example data flows through engine blocks within data compression accelerator 200 of FIG. 5. FIG. 6A illustrates example compression data flows. As illustrated in FIG. 6A, data compression accelerator 200 may perform static dictionary-based and dynamic history-based compression alone using only search block 206, DEFLATE compression using a combination of search block 206 and the encode portion of Huffman block 210, LZMA compression with or without static dictionary compression using a combination of search block 206 and the encode portion of RED block 208, range encoding alone using RED block 208, or JPG re-compression using JPG block 212. FIG. 6B illustrates example decompression data flows. As illustrated in FIG. 6B, data compression accelerator 200 may perform the first stage of DEFLATE decompression using the decode portion of Huffman block 210, the first stage of LZMA decompression with or without static dictionary decompression using the decode portion of RED block 208, or JPG decompression using JPG block 212. In the case of both DEFLATE and LZMA decompression with or without static dictionary decompression, RED block 208 may perform the second stage of decompression, i.e., length-distance pair expansion.

Figure 7A:
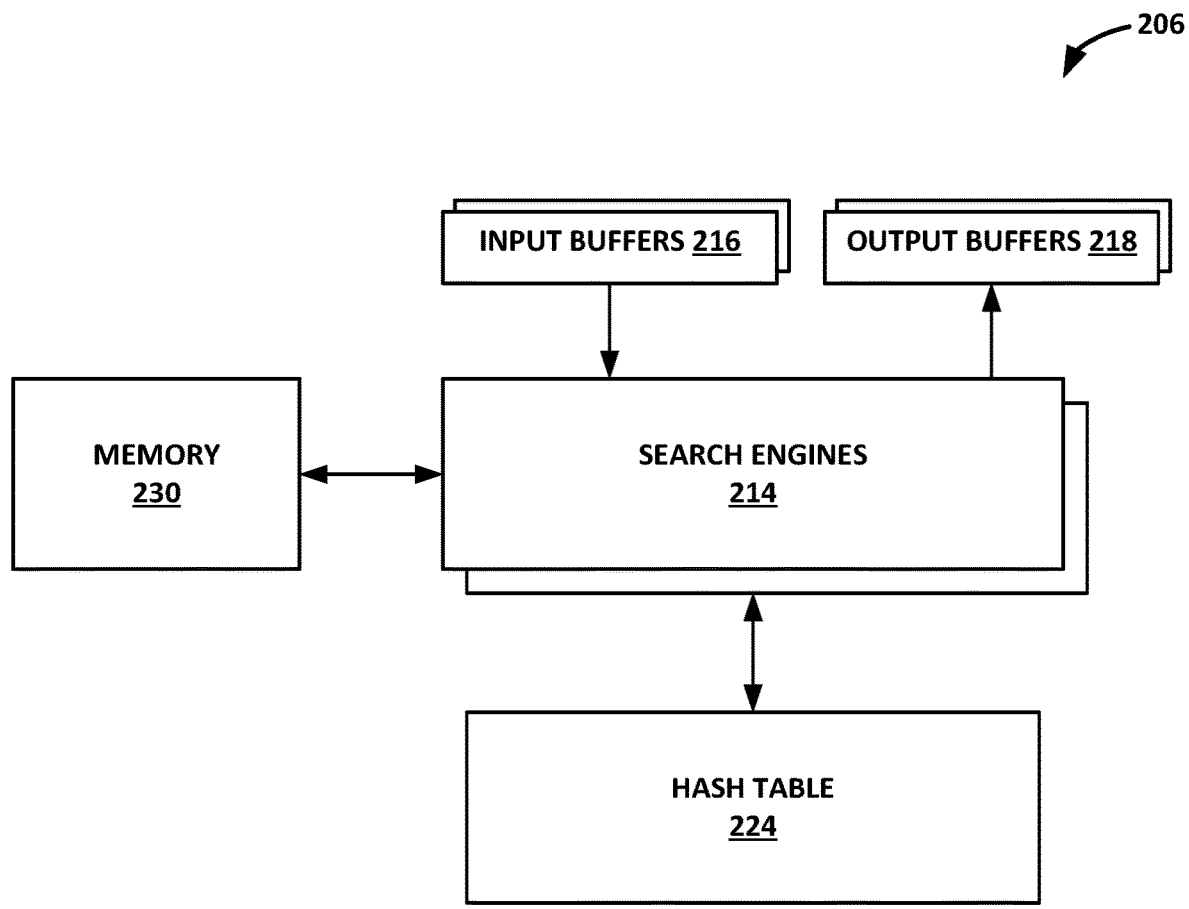
FIG. 7A is a block diagram illustrating an example architecture of a search block of the data compression accelerator from FIG. 5.

FIG. 7A is a block diagram illustrating an example architecture of search block 206 of data compression accelerator 200 from FIG. 5. According to the disclosed techniques, search block 206 includes multiple hardware search engines (i.e., threads) 214 each configured to perform static dictionary-based and dynamic history-based compression of an input data stream. As illustrated, search block 206 also includes input buffers 216, output buffers 218, a hash table 224, and a memory 230 that includes a history buffer and a static dictionary. As described in more detail below, hash table 224 may be a history address hash table used by search engines 214 to perform dynamic history-based compression, and the static dictionary within memory 230 may comprise a dictionary hash table used by search engines 214 to perform static dictionary-based compression. The architecture of search block 206 illustrated in FIG. 7A is shown for exemplary purposes only. In other examples, search block 206 may be configured in a variety of ways.

In some examples, search block 206 may include multiple search engines 214, multiple input buffers 216, and multiple output buffers 218. Each of the input buffers 216 includes a current block of data to be compressed by the respective one of search engines 214, and each of output buffers 216 includes a current block of compressed data output from the respective one of search engines 214. Search engines 214 may compress multiple separate input data streams in parallel, or a single input data stream may be split into multiple blocks and search engines 214 may work independently on separate blocks in parallel to improve throughput for the single input data stream. In the case of using multiple engines for a single input data stream, the output of each of search engines 214 will be merged after compression into a single output data stream. In either case, when using multiple engines, the portions of memory 230 used by each of search engines 214 cannot be shared between the threads.

Search block 206 may operate in at least two different modes including a high-throughput mode that uses the multiple search engines 214 (i.e., multi-thread), and a high-compression mode that uses only one of search engines 214 (i.e., single thread). Hash table 224 and memory 230 may each be configured differently depending on the operational mode of search block 206.

In the high-throughput mode, search block 206 may compress data faster, e.g., at 25 Gbps, with a moderate compression ratio. The higher throughput may be achieved by processing multiple byte positions of the input data stream per clock cycle per thread. In addition, the byte position processing may be performed using fewer history addresses, e.g., 4 addresses, of potential byte string matches included in each bucket of hash table 224 and a smaller history, e.g., up to 32 KB, copied into multiple memory banks of a history buffer within memory 230.

As an example, in the high-throughput mode, at each byte position of the data to be compressed, one of search engines 214 creates a hash key of the current byte and the next few bytes depending on the byte values. The one of search engines 214 then looks up the hash key in hash table 224 to get addresses of the most recent occurrences in the history buffer within memory 230 of a byte string beginning at the current byte position. The one of search engines 214 then matches the byte string identified by the addresses in the history buffer with the byte string at the current byte position in the data to be compressed. The one of search engines 214 is configured to perform this hashing and matching for multiple byte positions in the same clock cycle. The one of search engines 214 then selects the best option for the current byte position. For example, if the longest and closest match at the current byte position has a length that is greater than the hash key size, then the one of search engines 214 outputs a length-distance pair for the current byte position. Otherwise, the one of search engines 214 outputs a literal for the current byte position and repeats the process described above at the next byte position.

In the high-compression mode, search block 206 may achieve a higher compression ratio at a lesser throughput, for example, approximately 1 Gbps. The higher compression ratio may be achieved by processing multiple byte positions per clock cycle for the single thread using a larger number of history addresses (e.g., 16 or 32 history addresses) of potential byte string matches included in each bucket of hash table 224 and a larger history, e.g., up to 256 KB, that is stripped across multiple memory banks of the history buffer within memory 230. Furthermore, the higher compression ratio may be achieved by also processing one or more byte positions per clock cycle for the single thread using predefined common words having different word lengths stored in the static dictionary within memory 230.

Figure 7B:
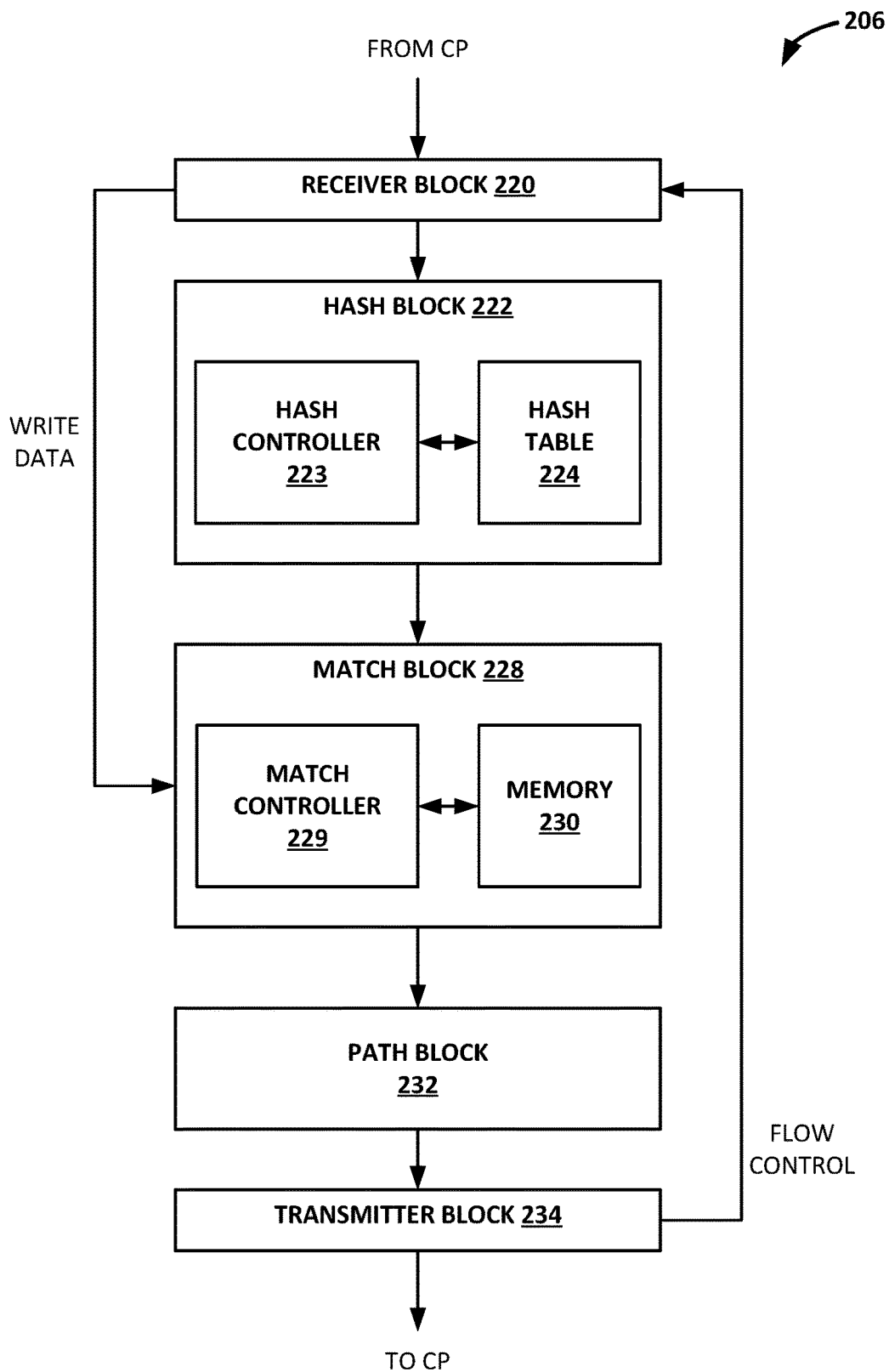
FIG. 7B is a block diagram illustrating another example architecture of the search block of the data compression accelerator from FIG. 5.

FIG. 7B is a block diagram illustrating another example architecture of search block 206 of data compression accelerator 200 from FIG. 5. According to the disclosed techniques, search block 206 comprises a pipeline for performing static dictionary-based and dynamic history-based compression of an input data stream. As illustrated, search block 206 includes a receiver block 220, a hash block 222, a match block 228, a path block 232, and a transmitter block 234. In general, hardware search engines 214 from FIG. 7A may be configured to perform the functions of the pipeline illustrated in FIG. 7B. The architecture of search block 206 illustrated in FIG. 7B is shown for exemplary purposes only. In other examples, search block 206 may be configured in a variety of ways.

As described above, search block 206 is configured to perform history-based compression, e.g., one of the LZ77, LZ78, LZW, LZ4, LZO, or LZS algorithms, and static dictionary-based compression to search for and replace occurrences of byte strings in an input data stream. Search block 206 uses a memory 230 that includes previously seen data of the input data stream as a self-referential, dynamic history for the history-based compression algorithm and a predefined list of common words having different word lengths as a static dictionary for the dictionary-based compression. In dynamic history-based compression, the history is maintained as a sequence of bytes, and byte strings in the input data stream are replaced by indices, e.g., length-distance pairs, that identify locations of the same byte strings in the history byte sequence. The self-referential, dynamic history is built as the input data stream is being compressed. The static dictionary is predefined to include common words having different word lengths, e.g., 3 bytes to 10 bytes. In some examples, search block 206 may perform the static dictionary-based and dynamic history-based compression as a first stage of a two-stage compression process. The second stage of the two-stage compression process may be entropy coding of the output of search block 206, which may be performed by either Huffman block 210 for DEFLATE compression or RED block 208 for LZMA compression.

The overall static dictionary-based and dynamic history-based compression algorithm performed by search block 206 will now be described. In general, the algorithm starts at byte position 0 of the input data stream and continues to the end of the file. The input data stream to be compressed is received by receiver block 220 of search block 206 from ingress DMA 203 of CP 202. Receiver block 220 is configured to handle flow control with CP 202 for the ingress interface so that CP 202 will not send more input data than receiver block 220 and, thus, the pipeline of search block 206 can handle. Receiver block 220 is also configured to respond to flow control from transmitter block 234 for the pipeline of search block 206 to avoid processing more data than transmitter block 234 can handle. Receiver block 220 writes data of the input data stream to a lookahead buffer in match block 228 and sends the data to hash block 222 for the main pipeline.

Receiver block 220 is configured to process control flits and distribute control signals to provide overall control for the pipeline of search block 206. As an example, a first flit of header data for the input data stream may include configuration data used to configure the pipeline of search block 206 for that input data stream. Receiver block 202 receives the first flit at the start of the input data stream and distributes the configuration data to the rest of the pipeline of search block 206. The first flit may include configuration data that indicates a level of effort or compression for the input data stream including whether a static dictionary is supported, a hash key size, a history buffer size, a lazy match window size, static dictionary loading information, checksum information, a compression type, and other commands and information.

As illustrated in FIG. 7B, hash block 222 includes hash controller 223 and hash table 224. As described above, hash table 224 may be a history address hash table. Hash controller 223 is configured to prepare a history hash key at a current byte position of the input data stream by selecting 'N' number of bytes starting with the current byte, e.g., 2 to 6 bytes. Hash controller 223 then uses the history hash key to calculate a history hash index into hash table 224. Hash controller 223 then uses the history hash index to access a bucket of hash table 224 that includes history addresses of any previous occurrences of byte strings that potentially match the current byte string beginning at the current byte position in the input data stream. History addresses that result from hash collisions may be filtered out. Hash controller 223 sends the history addresses of the previous occurrences to the match block 228, and writes the current byte position address into the same bucket in hash table 224. If the bucket is full, the oldest history address is dropped from the bucket in hash table 224 to add the current byte position address.

In an example where search block 206 is performing in a static dictionary mode, hash controller 223 is also configured to prepare a dictionary hash key at the current byte position of the input data stream having a length equal to the longest word length stored in the static dictionary, e.g., 10 bytes. Hash controller 223 then uses truncated versions of the dictionary hash key to calculate a dictionary hash index for each of the different word lengths, e.g., from 3 bytes to 10 bytes, in parallel from the hash key truncated for each of the different word lengths. The calculated dictionary hash indices comprise dictionary addresses of common words stored in the static dictionary that potentially match the current byte string beginning at the current byte position in the input data stream. Hash controller 223 may calculate only one dictionary address per word length in the static dictionary, e.g., up to 8 dictionary addresses for word lengths from 3 bytes to 10 bytes. Additional functions of hash block 222 are described in more detail below with respect to FIG. 8.

As illustrated in FIG. 7B, match block 228 includes match controller 229 and memory 230. For each of the history addresses received from hash block 222, match controller 229 is configured to read a byte string of previously seen data of the input data stream identified by the respective history address from a history buffer within memory 230. The retrieved byte string of the previously seen data is compared to the current byte string starting from the current byte position in a forward direction of the input data stream to determine forward matches. Backward matches may also be detected between the previously seen data and the current data starting from the current byte position in a backward direction of the input data stream. In some examples, matches longer than M bytes may be truncated, where M is a function of data alignment. Match controller 229 receives a list of matches between the current byte string and the previously seen data included in the history buffer within memory 230. Match controller 229 determines match length for each of the matches. For example, for each of the matches from the history buffer, match controller 229 may detect a "match byte" as a first non-matching byte after a match or a "previous byte" as the last byte that gets matched. Match controller 229 sends the match lengths for the list of matches to path block 232.

In an example where search block 206 is performing in a static dictionary mode, for each of the dictionary addresses received from hash block 222, match controller 229 is configured to read one of the common words having the word length identified by the respective dictionary address from the static dictionary within memory 230. Match controller 229 is configured to compare the retrieved word to the current byte string starting from the current byte position. In the static dictionary mode, match controller 229 determines a match only if all bytes of the common word retrieved from the static dictionary match the same number of bytes of the current byte string. For each of the matches from the static dictionary, match controller 229 may send zero as the "match byte." Additional functions of match block 228 are described in more detail below with respect to FIG. 9.

Path block 232 is configured to pick the best match (i.e., longest and closest, in that order) for each byte position of the input data stream from the match lengths received from match block 228. For example, path block 232 may be configured to find the longest match, if any, for the current byte position of the input data stream, including any overlapping matches from adjacent byte positions. For example, path block 232 may be configured to assemble longer matches by merging multiple smaller matches at previous and subsequent byte positions with the match at the current byte position. Path block 232 may support lazy optimizations in order to pick the best match based on multiple byte positions within a configurable window, as opposed to picking the best match based only on the current byte position.

For the selected matches at each byte position, path block 232 outputs length-distance pairs that replace the matched byte stings in the input data stream with pointers to either previous occurrences of the byte strings stored in the history buffer or matching common words stored in the static dictionary. If a match is not selected for a given byte position, path block 232 instead sends a literal that directly represents the byte at the given byte position. When search block 206 is performing LZMA compression with or without static dictionary compression, path block 232 may also report the first non-matching byte after the selected match and the previous byte, i.e., the last byte of the selected match. Path block 232 sends the literals and length-distance pairs to transmitter block 234. Additional functions of path block 232 are described in more detail below with respect to FIG. 12.

Transmitter block 234 is configured to handle flow control with receiver block 220 for the pipeline of search block 206 so that receiver block 220 will not process more data than transmitter block 234 and, thus, the pipeline of search block 206 can handle. Transmitter block 234 is also configured to respond to flow control from CP 202 for the egress interface to avoid transmitting more data than the egress interface can handle.

Transmitter block 234 is configured to pack the output received from path block 232 into a data stream that includes a sequence of literals and length-distance pairs for matches from the history buffer or the static dictionary within memory 230. In one example, a byte aligned format of the packed data stream includes a header having 1 byte of header data and a payload having 8 bytes of history-compressed data as literals and/or length-distance pairs. Each of the 8 bits of header data within the header describes one of the 8 bytes of history-compressed data within the payload. In some examples, literals may consume 1 byte of data, and length-distance pairs may consume 2 bytes to 4 bytes of data. The packed data stream of the history compressed output is transmitted by transmitter block 234 to CP 202. At CP 202, the history compressed output may be directly stored to an external memory via egress DMA 204, recirculated to RED block 208, or recirculated to Huffman block 210.

In accordance with techniques of this disclosure, the engine blocks within search block 206 are configurable to operate in different modes depending on the level of compression or effort desired for the input data stream. For example, in order to achieve high-throughput, each of the engine blocks within search block 206 may operate according to a multi-thread mode, which supports processing of multiple input data streams in parallel, and process multiple input byte positions per clock cycle per thread at lower compression levels. In the high-throughput mode, hash block 222 may perform multiple hash table accesses per cycle per thread but return a relatively small number of history addresses per access as potential matches, and match block 228 may support a relatively small history buffer within memory 230 with which to determine the string matches from the history addresses.

If a higher level of compression is desired, each of the engine blocks within search block 206 may operate according to a single thread mode, which supports processing of a single input data stream, and process multiple input byte positions per clock cycle for only the single thread using a more compute intensive string matching process. In the high-compression mode, hash block 222 may perform multiple hash table accesses per cycle for the single thread but return a relatively large number of history addresses as potential matches, and match block 228 may support a relatively large history buffer within memory 230 with which to determine the string matches from the history addresses. In the high-compression mode, hash block 222 may also compute multiple dictionary addresses, e.g., one for each of multiple word lengths, in parallel for a given input byte position, and match block 228 may support a static dictionary within memory 230 in addition to the history buffer. The different operational modes of the engine blocks within search block 206, and related hashing and matching solutions, are described in more detail below.

More details on a pipeline for performing dynamic history-based compression of an input data stream are available in U.S. patent application Ser. No. 16/195,209, filed Nov. 19, 2018, entitled "History-Based Compression Pipeline for Data Compression Accelerator of a Data Processing Unit," the entire content of which is incorporated herein by reference.

Figure 8:
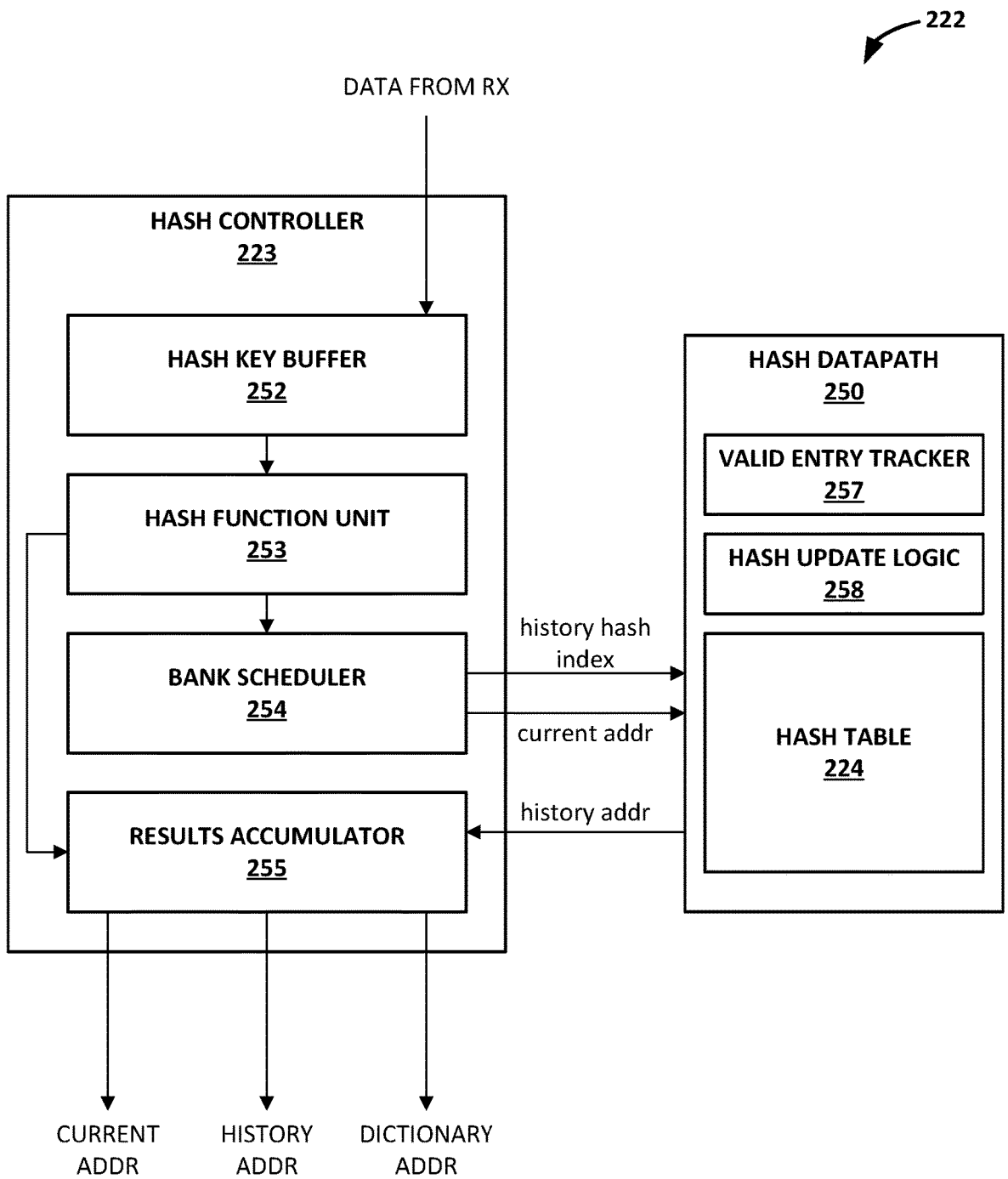
FIG. 8 is a block diagram illustrating an example architecture of a hash block of the search block from FIG. 7B.

FIG. 8 is a block diagram illustrating an example architecture of hash block 222 of search block 206 from FIG. 7B. In the illustrated example, hash controller 223 of hash block 222 includes a hash key buffer 252, a hash function unit 253, a bank scheduler 254, and a results accumulator 255. Hash datapath 250 of hash block 222 includes hash table 224 along with a valid entry tracker 257 and hash update logic 258. The architecture of hash block 222 illustrated in FIG. 8 is shown for exemplary purposes only. In other examples, hash block 222 may be configured in a variety of ways.

Hash block 222 is configurable to operate in different modes depending on the level of compression or effort desired for the input data stream. Hash table 224 is also configurable to support single or multi-thread processing and different hash table sizes depending on an operational mode of hash block 222. Hash table 224 comprises a history address hash table that includes a list of potential matches between byte strings of the current input data stream received from receiver block 220 and previously processed data of the input data stream that is stored in a history buffer. More specifically, hash table 224 includes a plurality of hash buckets that each holds the most recent history addresses of previous occurrences of byte strings in the history buffer.

In one example, hash table 224 may have a total storage of 128 k history addresses. For a dual thread mode, hash table 224 may be configured to include 16 banks each having 2 k rows or hash buckets, with each of the hash buckets including 4 hash entries (i.e., history addresses). Hash table 224 may be partitioned into two memories, one for each thread, that are isolated from each other such that each thread may only access its designated memory. In order to process multiple byte positions per clock cycle per thread, which requires multiple hash accesses per cycle per thread, each of the memories of hash table 224 may be configured into multiple banks (e.g., 8 banks of 2 k rows for a total of 16 k hash buckets with each of the hash buckets holding 4 history addresses). For a higher effort single thread mode, hash table 224 may comprise a single memory configured to include 8 k hash buckets with each of the hash buckets holding 16 history addresses. For the highest effort single thread mode, hash table 224 may comprise a single memory configured to include 4 k hash buckets with each of the hash buckets holding 32 history addresses. In order to process multiple byte positions per clock cycle for the single thread, the single memory of hash table 224 may similarly be configured into multiple banks (e.g., 8 banks, 4 banks, or 2 banks). In other examples, hash table 224 may be arranged in additional or different configurations.

Hash key buffer 252 of hash controller 223 is configured to prepare a history hash key at a current byte position of the input data stream received from receiver block 220 by selecting 'N' number of bytes starting with the current byte. In some examples, hash key buffer 252 may be a shift register that provides the history hash key to hash function unit 253. Hash key buffer 252 may support multiple history hash key sizes 'N', e.g., 2 to 6 bytes. In some examples, hash key buffer 252 may support an adaptive key size in which the history hash key size may change at each byte position of the input data stream based on whether the data starting at the respective byte position is binary or text. Use of the adaptive key size may reduce a number of hash collisions for the respective type of data. In general, a larger hash key size tends to cause fewer hash collisions for text data (i.e., data having byte values 0-127) whereas a smaller hash key size tends to cause fewer hash collisions for binary data (i.e., data having byte values 0-255). For example, in the adaptive mode, the history hash key size may be 4 bytes if the data is binary or non-text, and the history hash key size may be 5 bytes if the data is text.

Hash key buffer 252 may prepare multiple history hash keys per clock cycle per thread. For example, in a dual thread mode, hash key buffer 252 may be configured to prepare up to four history hash keys per cycle per thread. The multiple history hash keys may be an overlapping set of N-byte strings. For example, hash key buffer 252 may prepare a first history hash key by selecting a 4-byte string, e.g., "ABCD," starting with byte position 0 of the input data stream, prepare a second history hash key by an overlapping 4-byte string, e.g., "BCDE," starting with byte position 1 of the input data stream, and the like to prepare up to four history hash keys. In this example, each of the four hash keys is 4 bytes, which is equivalent to 7 bytes of output with overlapping keys. In other examples, each of the four hash keys may be up to 6 bytes, which is equivalent to 9 bytes of output with overlapping keys.

Hash function unit 253 of hash controller 223 receives the history hash key from hash key buffer 252, and applies a history hash function to the history hash key to calculate a history hash index into history address hash table 224. The hash function may be XOR (exclusive or operation) based. Hash function unit 253 may receive multiple history hash keys per clock cycle per thread from hash key buffer 252, and may calculate multiple history hash indices per clock cycle per thread. For example, in the dual thread mode, hash function unit 253 may calculate up to four history hash indices for up to four byte positions per cycle per thread.

According to the techniques of this disclosure, hash block 222 supports a static dictionary mode in which a byte string search may be conducted using a static dictionary of common words having different word lengths instead of or in addition to the self-referential, dynamic history of the input data stream. In the static dictionary mode, hash key buffer 252 of hash controller 223 is configured to prepare a dictionary hash key at a current byte position of the input data stream received from receiver block 220 by selecting a number of bytes equal to the longest word length stored in the static dictionary, e.g., 10 bytes, starting with the current byte.

Hash function unit 253 of hash controller 223 receives the dictionary hash key from hash key buffer 252, and applies a dictionary hash function to truncated versions of the dictionary hash key to calculate multiple dictionary hash indices in parallel. For example, hash function unit 253 applies the dictionary hash function to the dictionary hash key beginning at the current byte position and truncated to each of the different word lengths stored in the static dictionary, e.g., 8 different word lengths from 3 bytes to 10 bytes. The calculated dictionary hash indices comprise dictionary addresses of common words stored in the static dictionary that potentially match the current byte string beginning at the current byte position in the input data stream. The static dictionary comprises a dictionary hash table. Hash function unit 253 may calculate only one dictionary address per word length in the static dictionary, e.g., 8 dictionary addresses for word lengths from 3 bytes to 10 bytes. Hash function unit 253 sends the calculated dictionary addresses directly to results accumulator 255 of hash controller 223.

Bank scheduler 254 of hash controller 223 is configured to schedule accesses to hash table 224 using the history hash indices calculated by hash function unit 253. More specifically, hash datapath 250 uses a history hash index to access a bucket of hash table 224 that includes the most recent history addresses of previous occurrences of byte strings that potentially match the current byte position beginning at the current byte position in the input data stream. Bank scheduler 254 also sends the current byte position address to hash datapath 250 to write the current byte position address in the same bucket of hash table 224 identified by the hash index to make the current byte string available for future matching from the history buffer.

Bank scheduler 254 may be most useful when processing more than one byte position per clock cycle due to the potential for bank conflicts, in which more than one hash access is attempted in the same memory bank of hash table 224 in the same clock cycle. Processing more than one byte position per clock cycle requires more than one hash table access per clock cycle as bank scheduler 254 attempts to read hash table 224 for all of the history hash keys prepared per clock cycle. In one of the examples discussed above, in the dual thread mode, hash table 224 may be partitioned into two memories, one for each thread, with the memory for each of the threads being partitioned into 8 banks and with each of the banks having 2 k hash buckets each holding 4 history addresses. In this example, bank scheduler 254 is configured to attempt to schedule up to 4 hash accesses per clock cycle per thread.

Bank scheduler 254 attempts to schedule the multiple hash table accesses in the same clock cycle to independent banks of hash table 224, thereby avoiding bank conflicts. For example, bank scheduler 254 may include 8 entries and schedule accesses to 8 banks of hash table 224. Bank scheduler 254 may use the lower bits of each of the history hash indices to select the one of the hash banks of hash table 224 to which to schedule the access for the given history hash index. For a highest throughput mode, hash scheduler 254 may run in a no-stall mode and discard any entries that do not get scheduled due to hash bank conflicts. For higher effort modes, hash scheduler 254 may take additional clock cycles to retry hash accesses in order to reschedule as many entries as possible before discarding the unscheduled entries.

Entries in bank scheduler 254 will have corresponding entries in result accumulator 255. Entries in bank scheduler 254 are written in order, but hash table accesses can happen out of order. A given entry in bank scheduler 254 may remain busy until the corresponding entry in result accumulator 255 has been cleared, which also happens in order. In the case where multiple scheduler entries are accessing the same history hash index, then only one hash access is required for that group of entries.

Bank scheduler 254 may also insert bubbles in the pipeline to accommodate history buffer writes, depending on the mode. As a function of effort level, bank scheduler 254 may insert bubbles into the pipeline to allow history buffer writes to be scheduled without affecting history buffer reads. At the highest throughput mode (e.g., a multi-thread mode), bubbles may not be inserted for history writes and writes may instead be scheduled ahead of reads, as needed.

Hash datapath 250 includes valid entry tracker 257, hash update logic 258, and hash table 224. As described above, hash table 224 comprises a history address hash table and is configurable to support single or dual thread processing and different hash table sizes depending on an operational mode of hash block 222. In the example where hash table 224 has a total storage of 128 k history addresses, hash table 224 may be arranged in three different configurations. For a dual thread mode, hash table 224 may comprise two memories, one for each thread, each configured to include 16 k hash buckets with each of the hash buckets holding 4 history addresses. For a higher effort single thread mode, hash table 224 may comprise a single memory configured to include 8 k hash buckets with each of the hash buckets holding 16 history addresses. For a highest effort single thread mode, hash table 224 may comprise a single memory configured to include 4 k hash buckets with each of the hash buckets holding 32 history addresses.

Hash table 224 may need to be initialized at the start of a new input data stream to remove any stale data left in hash table 224 and avoid security implications. In one example, hash datapath 250 may use a state machine to clear hash table 224 at the start of every stream, but that would require thousands of clock cycles, e.g., 2 k clock cycles. In another example, hash datapath 250 may use valid entry tracker 257, i.e., an auxiliary data structure, to hold the initialization state of each word of each row. For example, valid entry tracker 257 may hold 32 k bits of initialization state, e.g., 2 k bits per bank for 16 banks with each bit representing a row in the respective bank. When valid entry tracker 257 indicates that a word has not been initialized, hash datapath 250 may replace the read data with a default value.

When accessing hash table 224, hash update logic 258 of hash datapath 250 performs two operations. First, hash update logic 258 uses a history hash index to read a corresponding one of the hash buckets of hash table 224 to get a list of history addresses that are potential matches for the current byte string at the current byte position in the input data stream. Second, hash update logic 258 writes the current byte position to the same one of the hash buckets of hash table 224, dropping the oldest history address if the hash bucket is already full. Hash datapath 250 returns the history addresses read from hash table 224 during each hash access per cycle per thread to results accumulator 255 of hash controller 223.

As described above, hash collisions, in which different hash keys result in the same hash index, may be reduced by use of adaptive hashing in which the key size is different based on the respective type of data, i.e., text or binary, used to prepare the hash key. When hash collisions occur, however, hash update logic 258 may be configured to filter out any invalid history addresses that result from the hash collisions. For example, an invalid history address may be a history address that is stored in a hash bucket identified by a hash index determined from a given hash key, but that points to a previous occurrence of data represented by a different hash key that results in the same hash index.

Results accumulator 255 of hash controller 223 receives the history addresses from hash datapath 250 and receives the dictionary addresses from hash function unit 253. Results accumulator 255 then sends the history addresses and the dictionary addresses to the match block 228. Result accumulator 255 holds the output of the hash table reads (i.e., the history addresses) and the dictionary hash function (i.e., the dictionary addresses) until it is time to send the addresses to match block 228. Results accumulator 255 may reorder the results when processing multiple byte positions per cycle per thread. In some examples, results accumulator 255 may send up to 16 history addresses per cycle per thread to match block 228. For static dictionary mode, which is a single thread mode, results accumulator 255 may send up to 16 history addresses plus 8 dictionary addresses per cycle. Results accumulator 255 also sends each of the byte position addresses processed per cycle to match block 228.

More details on adaptive hashing and other operations of a hash block for dynamic history-based compression are available in U.S. patent application Ser. No. 16/195,290, filed Nov. 19, 2018, entitled "Hashing Techniques in Data Compression Accelerator of a Data Processing Unit," the entire content of which is incorporated herein by reference.

Figure 9:
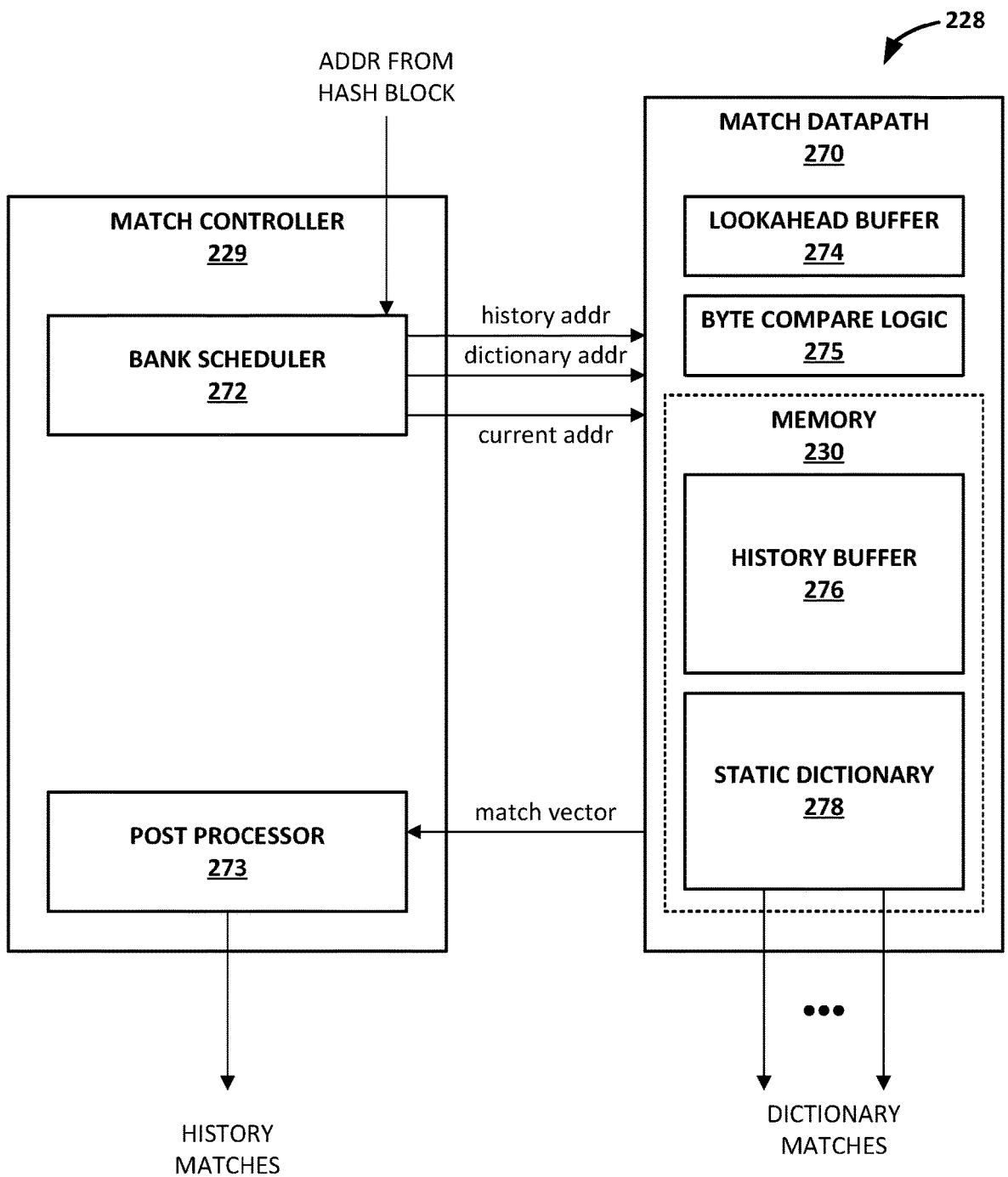
FIG. 9 is a block diagram illustrating an example architecture of a match block of the search block from FIG. 7B.

FIG. 9 is a block diagram illustrating an example architecture of match block 228 of search block 206 from FIG. 7B. In the illustrated example, match controller 229 of match block 228 includes a bank scheduler 272 and a post processor 273. Match datapath 270 of match block 228 includes memory 230 having a history buffer 276 and a static dictionary 278, along with a lookahead buffer 274 and byte compare logic 275. The architecture of match block 228 illustrated in FIG. 9 is shown for exemplary purposes only. In other examples, match block 228 may be configured in a variety of ways.

Match block 228 is configurable to operate in different modes depending on the level of compression or effort desired for the input data stream. Memory 230 is also configurable to support single or multi-thread processing with different memory bank arrangements in history buffer 276 and static dictionary 278 depending on an operational mode of match block 228. For example, in a single thread mode, memory 230 may support a large history buffer 276 having a size of up to 256 KB, and a small static dictionary 278 having a size of up to 32 KB. As another example, in the single thread mode, memory 230 may support a small history buffer 276 having a size of up to 32 KB, and a large static dictionary 278 having a size of up to 256 KB. Each of history buffer 276 and static dictionary 278 may include 8 banks with independent read ports each supporting 16 byte unaligned or 32 byte aligned accesses. In a single or multi-thread mode in which static dictionary is not supported, memory 230 may instead support both a large history buffer configured to hold a full history and a small history buffer configured to hold a most recent portion of the full history, per thread. In this case, across both the large history buffer and the small history buffer, memory 230 may include 16 banks with independent read ports each supporting 16 byte unaligned or 32 byte aligned accesses.

Figure 10A:
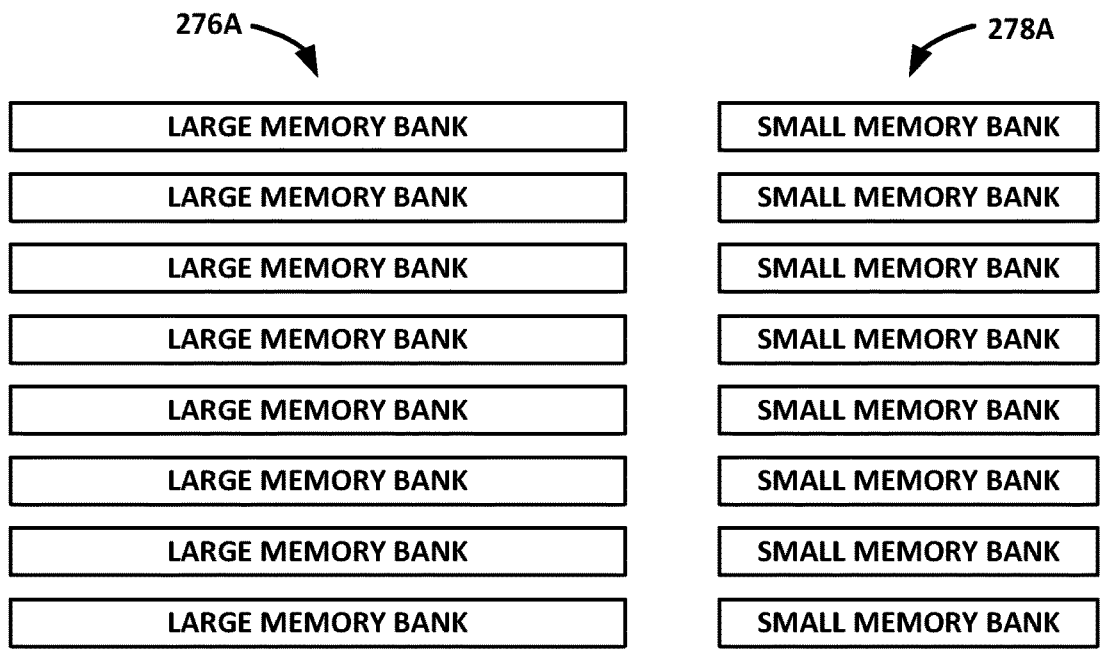
FIGS. 10A and 10B are conceptual diagrams illustrating different example configurations of a history buffer and a static dictionary.
Figure 10B:
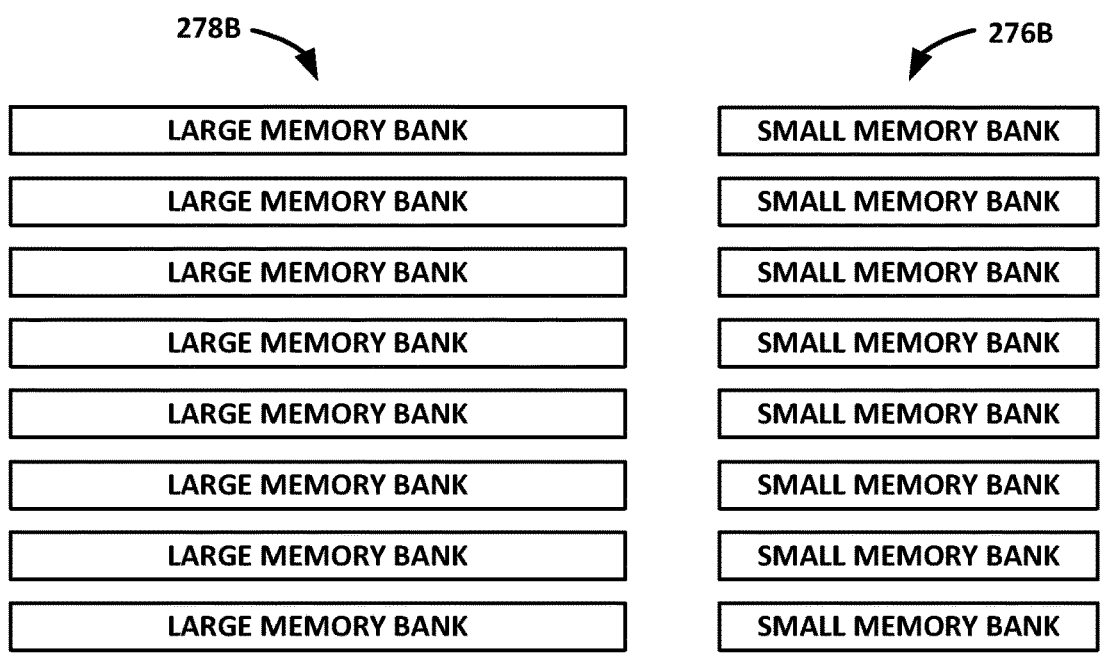

FIGS. 10A and 10B are conceptual diagrams illustrating different example configurations of history buffer 276 and static dictionary 278. In other examples, history buffer 276 and static dictionary 278 may be arranged in additional or different configurations. A single memory may be partitioned into multiple banks to enable multiple accesses to the single memory in the same clock cycle, e.g., one access per bank per cycle. In some examples, each of the banks may hold a contiguous portion of the memory. This may work well in the case of static dictionary-based compression where the dictionary addresses for the potential matches for a current byte position are evenly distributed across the different word lengths in the static dictionary such that the probability of bank conflicts is low. In the case of dynamic history-based compression, the history addresses for the potential matches for a current byte position are likely to be close to each other within the history buffer. In this scenario, instead of partitioning a history buffer into multiple banks of contiguous data, the history buffer may be partitioned into multiple banks and the data is striped across the multiple banks. In this way, each of the memory banks includes a plurality of non-contiguous stripes or bands with each of the stripes holding a fixed amount of contiguous data.

FIG. 10A illustrates an example configuration of memory 230 in the static dictionary mode. As one example, for the single thread mode, a maximum history size may be 256 KB. In that example, a large history buffer 276A is configured to include a set of 8 large memory banks each containing 32 KB for a total of 256 KB. The full history may be spread across the large memory banks of large history buffer 276A using memory striping to spread access evenly across the banks. For example, large history buffer 276A may use a 256 byte stripe size. In addition, a small static dictionary 278A is configured to include a set of 8 small memory banks each containing 4 KB for a total of 32 KB. Each of the 8 small memory banks may store a plurality of common words having a given word length. For example, a first small memory bank may store a plurality of common words having a word length of 3 bytes with subsequent small memory banks storing common words having incrementally longer word lengths up to the last small memory bank storing a plurality of common words having a word length of 10 bytes.

FIG. 10B illustrates another example configuration of memory 230 in the static dictionary mode. In this example, a large static dictionary 278B is configured to include a set of 8 large memory banks each containing 32 KB for a total of 256 KB. Each of the 8 large memory banks may store a plurality of common words having a given word length. For example, a first large memory bank may store a plurality of common words having a word length of 3 bytes with subsequent large memory banks storing common words having incrementally longer word lengths up to the last large memory bank storing a plurality of common words having a word length of 10 bytes. In addition, a small history buffer 276B is configured to include a set of 8 small memory banks each containing 4 KB for a total of 32 KB. The 32 KB included in small history buffer 276B may be the most recent 32 KB of the full history. The most recent history may be spread across the small memory banks of small history buffer 276B using memory striping to spread access evenly across the banks. For example, small history buffer 276B may use a 256 byte stripe size.

More details on data striping of a history buffer for dynamic history-based compression are available in U.S. patent application Ser. No. 16/195,617, filed Nov. 19, 2018, entitled "Data Striping for Matching Techniques in Data Compression Accelerator of a Data Processing Unit," the entire content of which is incorporated herein by reference.

Returning to FIG. 9, bank scheduler 272 of match controller 229 is configured to schedule accesses to memory 230 in match datapath 270 using the history addresses and dictionary addresses received from hash block 222. For example, byte compare logic 275 of match datapath 270 uses the history addresses to read a byte string of previously processed data from history buffer 276, and then compares the retrieved byte string of the previously processed data to a current byte string starting from the current byte position address in the input data stream to determine potential matches. As another example, byte compare logic 275 uses the dictionary addresses to read a word having the same word length as specified by the static dictionary address from static dictionary 278, and then compare the retrieved word of the given word length to the current byte string starting from the current byte position address in the input data stream to determine potential matches. The input data stream is written to lookahead buffer 274 of match datapath 270 by receiver block 220 of search block 206. Bank scheduler 272 may compute a lookahead address in lookahead buffer 274 based on the current byte position address received from hash block 222 to be used by byte compare logic 275 for the comparisons to the potential matches in history buffer 276 and static dictionary 278.

Bank scheduler 272 may operate in different modes depending on the level of compression or effort desired for the input data stream. For a highest throughput mode, bank scheduler 272 attempts to schedule as many accesses to history buffer 276 as possible in one clock cycle. For example, in the dual thread mode, history buffer 276 may be configured to include 8 memory banks per thread. In this example, bank scheduler 272 may receive up to 16 history addresses from hash block 222 per cycle per thread, and schedule as many accesses as possible to the 8 banks of history buffer 276 per cycle per thread. Any scheduling entries for the history addresses that cannot be scheduled during the single clock cycle, e.g., due to bank conflicts, may be discarded.

For higher effort modes in which static dictionary is supported, bank scheduler 272 attempts to schedule as many accesses to history buffer 276 and static dictionary 278 as possible over a fixed number of clock cycles, e.g., 1 or 2 or 4 clock cycles. For example, in the single thread mode, history buffer 276 and static dictionary 278 may be configured as shown in FIG. 10A or 10B to each include 8 memory banks. In this example, bank scheduler 272 may receive up to 16 history addresses from hash block 222 per cycle, and schedule as many accesses as possible to the 8 banks of history buffer 276 over the fixed number of cycles. Similarly, bank scheduler 272 may receive up to 8 dictionary addresses from hash block 222 per cycle, and schedule as many accesses as possible to the 8 banks of static dictionary 278 over the fixed number of cycles. Any scheduling entries for the history addresses or dictionary addresses that cannot be scheduled during the fixed number of clock cycles, e.g., due to bank conflicts, may be discarded.

Bank scheduler 272 is also configured to schedule writes of the byte strings at the current byte position addresses of the input data stream to history buffer 276 in match datapath 270. In this way, match block 228 may continually add the most recent data from the input data stream to the self-referential, dynamic history. The writes may be scheduled from lookahead buffer 274 to history buffer 276. Lookahead buffer 274 may be a 128-byte buffer configured to hold the input data stream. Lookahead buffer 274 may also function as a write buffer with support of write-to-read bypass. Once a given chunk of write data has accumulated in lookahead buffer 274, e.g., 32-bytes, and the current byte position in the input data stream has moved passed that data chunk, bank scheduler 272 may schedule a write of that data from lookahead buffer 274 to history buffer 276. For the highest throughput mode, bank scheduler 272 may track when a write is needed and schedule the write at higher priority than a read. For higher effort modes, hash block 222 may schedule a bubble for every chunk, e.g., 32-bytes, of data processed so that match block 228 has time to schedule the write to the history buffer 276 without interfering with reads. Hash block 222 may only explicitly insert bubbles if it detects the chunk of data processed without any other source of bubble.

Byte compare logic 275 compares the data in lookahead buffer 274 to the data in history buffer 276 to find a matching sequence of bytes. More specifically, byte compare logic 275 is configured to compare a current byte string on a byte-by-byte basis starting from a current byte position of the input data stream stored within lookahead buffer 274 with the potentially matching byte strings read from history buffer 276 at the history addresses received from hash block 222. The comparison may continue on the byte-by-byte basis from the current byte position up to a non-matching byte such that the determined match may have a variable match length. Byte compare logic 275 creates a list of matches, i.e., a match vector, between the current byte string and the previous occurrences of byte strings from history buffer 276. The match vector is sent back to match controller 229 for the match lengths to be counted by post processor 273 of match controller 229.

As part of the match checking process, match block 228 may be configured to perform backward matching within history buffer 276. Backward matching may be used to determine whether one or more bytes immediately preceding a current byte position in the input data stream also match the data within history buffer 276. In some examples, a potential match beginning at one of the preceding byte positions may have been missed due to a bank conflict or hash collision at hash block 222. The result of backward matching may be identification of a longer history match for a byte string in the input data stream and, hence, higher compression of the input data stream.

Post processor 273 is configured to process the match vector from match datapath 270 and send the results to path block 232. Post processor 273 determines a match length for each of the matches included in the match vector. More specifically, post processor 273 counts the number of matching bytes for each history buffer access. The count starts at the current byte position and goes forward as many bytes as possible for the forward matches. For example, for each of the matches, match controller 229 may count until detecting a "match byte" as a first non-matching byte after a match or a "previous byte" as the last byte that gets matched. Post processor 273 may similarly count backwards from the current byte position for the backward matches. Post processor 273 sends the forward and backward match lengths for each of the matches to path block 232.

In some examples, the match lengths may be included in an indication sent from match block 228 to path block 232 of whether at least one history match occurs for the current byte string from history buffer 276. The indication may include the literal of original data at the current byte position and a number of matches. For each of the matches, the indication may include a length of any forward match and a length of any backward match for the current byte string. In the case where no match occurs for the current byte sting, the indication may include the literal of original data at the current byte position with number of matches set equal to zero.

According to the techniques described in this disclosure, byte compare logic 275 also compares the data in lookahead buffer 274 to the data in static dictionary 278 to find a matching sequence of bytes. Byte compare logic 275 is configured to compare the current byte string starting from a current byte position of the input data stream stored within lookahead buffer 274 with each of the potentially matching words having different word lengths read from static dictionary 278 at the dictionary addresses received from hash block 222. The comparison is performed for the entire word length of each of the potentially matching words such that a match is only determined if the current byte string matches all bytes of the given word length.

Indications may be sent from match block 228 to path block 232 of whether a dictionary match occurs for the current byte string from static dictionary 278 at each of the different word lengths in static dictionary 278. More specifically, the indications may be sent directly from each of the memory banks of static dictionary 278 to path block 232 on a dedicated line for the word length associated with the respective one of the memory banks. The literal of original data may be sent once for the current byte position, and then each of the indications may specify whether or not a match occurred at the respective word length. In the static dictionary mode, the indication may not need to explicitly indicate a length of the match. Instead, the match length may be known based on the indication being received on the dedicated line for the word length associated with the respective one of the memory banks.

More details on backward matching and other operations of a match block for dynamic history-based compression are available in U.S. patent application Ser. No. 16/195,564, filed Nov. 19, 2018, entitled "Matching Techniques in Data Compression Accelerator of a Data Processing Unit," the entire content of which is incorporated herein by reference.

Figure 11:
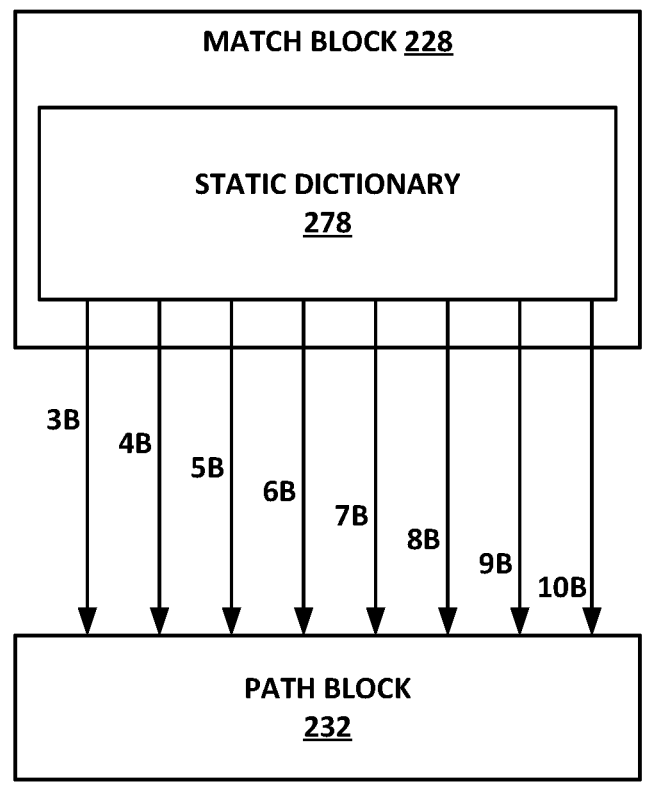
FIG. 11 is a block diagram illustrating an example architecture of dedicated lines for different static dictionary word lengths between the match block and a path block of the search block from FIG. 7B.

FIG. 11 is a block diagram illustrating an example architecture of dedicated lines for different static dictionary word lengths between the match block and a path block of the search block from FIG. 7B. As described above, static dictionary 278 may be configured to include a set of multiple memory banks with each of the memory banks storing a plurality of common words having one of multiple different word lengths stored by static dictionary 278. In the case where static dictionary 278 includes a set of 8 memory banks, static dictionary 278 may store predefined sets of common words having 8 different word lengths. In the example of FIG. 11, static dictionary 278 of match block 228 includes 8 lines connected to path block 232 with each of the lines being dedicated to a different one of the 8 banks for the 8 different word lengths stored in static dictionary 278. In this example, static dictionary 278 stores predefined common words having word lengths of 3 bytes, 4, bytes, 5 bytes, 6 bytes, 7 bytes, 8 bytes, 9 bytes, and 10 bytes.

When a match occurs for the current byte string at one of the different word lengths, static dictionary 278 sends a literal of original data at the current byte position, and sends an indication that the match occurred on the dedicated line for the one of the different word lengths. In the case where a match does not occur for the current byte string at one of the different word lengths, static dictionary 278 sends the literal of original data at the current byte position, and sends an indication that the match did not occur on the dedicated line for the one of the different word lengths.

Figure 12:
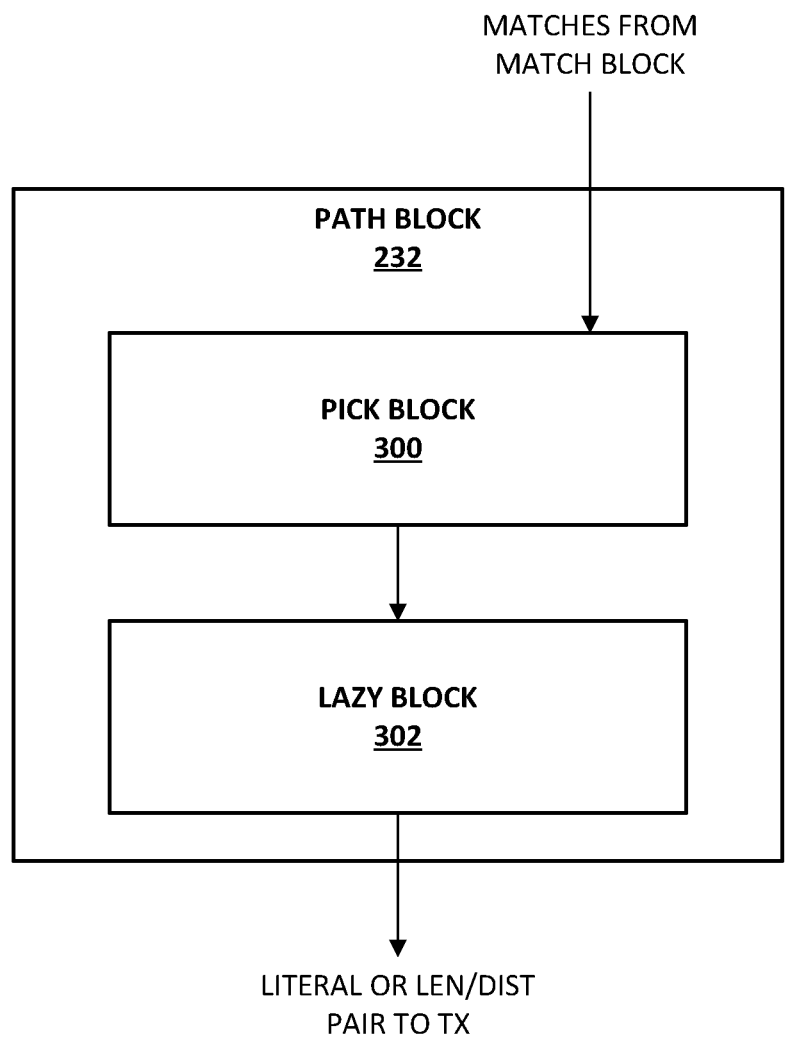
FIG. 12 is a block diagram illustrating an example architecture of a path block of the search block from FIG. 7B.

FIG. 12 is a block diagram illustrating an example architecture of path block 232 of search block 206 from FIG. 7B. In the illustrated example, path block 232 includes a pick block 300 and a lazy block 302. The architecture of path block 232 illustrated in FIG. 12 is shown for exemplary purposes only. In other examples, path block 232 may be configured in a variety of ways.

Path block 232 is configured to pick the best match (i.e., longest and closest, in that order) for each byte position of the input data stream based on the matches received from match block 228. For example, path block 232 receives an indication of a set of matches for the current byte position from the history buffer that indicates match lengths for each of the matches, and indications of individual matches for the current byte string from the static dictionary at different word lengths. Path block 232 may perform three main functions: find the best match at each byte position, select the best match within a lazy evaluation window, and/or apply post processing to merge consecutive matches to form a longer match.

Pick block 300 of path block 232 is configured to find the best match at each byte position in the input data stream, but pick block 300 may not make the final decision of whether that best match should be used for the current byte position. As one example, the selection process performed by pick block 300 may first identify the longest match for the current byte position, and, if there is a tie among two or more matches, pick block 300 may select the match having the smallest distance from the current byte position.

Pick block 300 may consider the following sources of potential matches: forward matches from the current byte position, backward matches from subsequent byte positions, and carry forward matches from previous byte positions. In the case of backward matches, pick block 300 may consider the match lengths applied at the current byte position by any backward matches from subsequent byte positions when selecting the best match for the current byte position. In the case of carry forward matches, pick block 300 may consider the match lengths applied at the current byte position by any matches from previous byte positions when selecting the best match for the current byte position. For example, pick block 300 may look at a match of length 7 at a previous byte position that is truncated to a match of length 6 at the current byte position to identify the best match for the current byte position. Pick block 300 may look at the same match at a subsequent byte position that is truncated to a match of length of 5, and so on.

Lazy block 302 of path block 232 is configured to determine whether to emit a literal or a match, or nothing if a match is emitted at a previous position, for each of one or more byte positions within a window of the input data stream that includes the current byte position. Lazy block 302 may perform either a greedy match or a lazy match within a lazy window. For the greedy method, lazy block 302 uses the best match that is detected by pick block 300 for the current byte position. Lazy block 302 may select the output for the current byte position based on the best match from among all the matches received for the current byte position from match block 228 based on the history addresses and the dictionary addresses identified by hash block 222. For a highest throughput mode, lazy block 302 may select the output based on the best match from among the 4 history addresses searched for the current byte position. For higher effort modes without static dictionary support, lazy block 302 may select the output based on the best match from among the 16 history addresses searched for the current byte position. For higher effort modes in which a static dictionary is supported, lazy block 302 may select the output based on the best match from among the 8 history addresses and 8 dictionary addresses searched for the current byte position.

For the lazy method, lazy block 302 looks at the next N byte positions within a lazy window and selects the output for the current byte position based on the best match across all of the byte positions within the lazy window. For example, if the best match at the current byte position is not the best match based on all of the byte positions within the lazy window, lazy block 302 may discard the best match at the current byte position and instead emit a literal of the original data at the current byte position. If any of the other byte positions within the lazy window affect the current byte position, lazy block 302 may update (e.g., merge or extend) the match lengths at the current byte position. After the match lengths are updated, lazy block 302 may determine the best match for the current byte position based on the current lazy window. The lazy window may then advance by 1 to the next byte position in the input data stream, and lazy block 302 may make the same determination within the new lazy window.

The lazy window may be configurable with size N set equal to an integer value between 0 and 2, where 0 is used to indicate the greedy method. For a lazy window of size 2, lazy block 302 may select the output for the current byte position based on the best match from among all the matches determined for the current byte position within the moving lazy window. For a highest throughput mode, lazy block 302 may select the output based on the best match from among 12 history addresses searched for the 3 positions within the lazy window. For higher effort modes without static dictionary support, lazy block 302 may select the output based on the best match from among the 48 history addresses searched for the 3 positions within the lazy window. For higher effort modes in which a static dictionary is supported, lazy block 302 may select the output based on the best match from among the 24 history addresses and 24 dictionary addresses searched for the 3 positions within the lazy window.

If the best match at the current byte position is a longest match within the lazy window, lazy block 302 emits a length-distance pair as a reference to the best match at the current byte position. When the best match at the current byte position comprises a match for the current byte string from history buffer 276, the length-distance pair identifying the match for the current byte string includes a length set equal to a length of the repeated byte string beginning at the current byte position in the input data stream and a distance set equal to the distance from the current byte position to a history address of the previous occurrence of the byte string in history buffer 276. When the best match at the current byte position comprises a match for the current byte string from static dictionary 278 at one of the different word lengths, the length-distance pair identifying the match for the current byte string includes a length set equal to the one of the different word lengths and a distance set to a sum of a maximum size of history buffer 276 and an offset of the matching word in static dictionary 278. For example, the distance may be set equal to the sum of the maximum size of the history buffer (e.g., 256 KB) plus a dictionary address of the matching word in the static dictionary. The distance of the length-distance pair being set greater than the maximum size of the history buffer indicates that the length-distance pair is a reference to static dictionary 278 as opposed to history buffer 276.

When a match is selected for the current byte position based on the current lazy window, lazy block 302 may hold the match instead of immediately outputting the match to transmitter block 234. Lazy block 302 may use the held matches to determine which byte positions in the input data stream have already been covered by a previous match such that nothing needs to be emitted for those byte positions. Lazy block 302 may also use the held matches to identify and merge consecutive matches to form longer matches. For example, lazy block 302 may look at additional matches for subsequent byte positions within the moving lazy window to determine whether to modify the held match for the current byte position. If any of the subsequent matches extend the original match, i.e., if any of the subsequent matches are at the same distance and the end of the match extends further, lazy block 302 may modify the original match to extend the length.

Once the output is selected for the byte positions being processed, lazy block 302 sends up to 4 literals and/or length-distance pairs per clock cycle per thread to transmitter block 234 for output from search block 206. For each output match from history buffer 276, lazy block 302 may append the "match byte" as the first non-matching byte after the match or the "previous byte" as the last byte that gets matched. For each output match from static dictionary 278, lazy block 302 may send zero as the "match byte." This information may be used by RED block 208 to generate context for encoding the next byte using LZMA compression.

More details on match merging, output selection, and other operations of a path block for dynamic history-based compression are available in U.S. patent application Ser. No. 16/195,644, filed Nov. 19, 2018, entitled "Merging Techniques in Data Compression Accelerator of a Data Processing Unit," the entire content of which is incorporated herein by reference.

Figure 13:
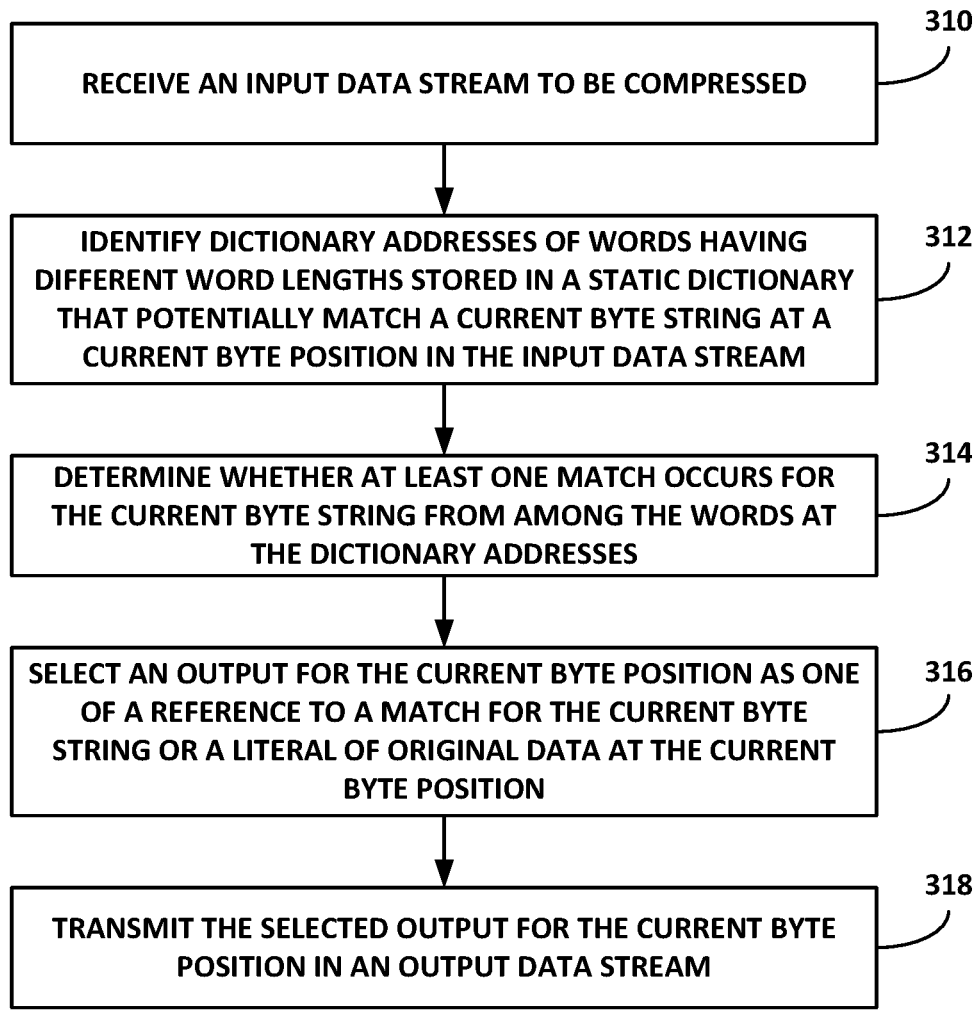
FIG. 13 is a flowchart illustrating an example static dictionary-based data compression operation performed in accordance with the techniques of this disclosure.

FIG. 13 is a flowchart illustrating an example static dictionary-based data compression operation performed in accordance with the techniques of this disclosure. The operation illustrated in FIG. 13 may be performed by, e.g., the components of search block 206 from FIGS. 7A and 7B, or other devices in other examples. Furthermore, the operation of FIG. 13 may be performed in a different order or with fewer operations than what is shown in FIG. 13. As illustrated in FIG. 7B, search block 206 is implemented as a pipeline for performing static dictionary-based and dynamic history-based compression on an input data stream. More specifically, search block 206 replaces a string of bytes in the input data stream with a reference to either a previous occurrence of the same string of bytes stored in a dynamic history of the input data stream or a common word of a given length stored in a static dictionary to achieve compression.

Search block 206 receives an input data stream to be compressed (310). Hash block 222 of search block 206 identifies one or more dictionary addresses of one or more words having different word lengths stored in a static dictionary that potentially match a current byte string beginning at a current byte position in the input data stream (312). More specifically, hash block 222 is configured to prepare a 'history key' at a current byte position in the input data stream by selecting 'N' number of bytes starting with the current byte position and use the key to calculate a hash index into a history address hash table. Hash block 222 uses the hash index to access a bucket of the history address hash table that contains history addresses of previous occurrences of byte strings stored in a history buffer. Hash block 222 is also configured to a prepare a 'dictionary key' at the current byte position and use truncated versions of the key to calculate multiple hash indices in parallel as static dictionary addresses of common words having different words lengths stored in the static dictionary. Hash block 222 then sends the history addresses of the previous occurrences to match block 228 and records the current byte position address into the same bucket in the history address hash table. Hash block 222 also sends the dictionary addresses of the common words to match block 228.

Match block 228 of search block 206 determines whether at least one match occurs for the current byte string from among the one or more words at the dictionary addresses (314). More specifically, match block 228 is configured to determine whether string matches have occurred by comparing the byte string beginning at the current byte position in the input data stream to the previous occurrences of byte strings stored in a history buffer at the history addresses received from hash block 222 and to the common words having the different words lengths stored in the static dictionary at the dictionary addresses received from hash block 222. In this way, for the current byte position, match block 228 may determine matches from both the dynamic history and the static dictionary, and send the matches to path block 232.

Path block 232 of search block 206 selects an output for the current byte position, wherein the output for the current byte position comprises one of a reference to a match for the current byte string or a literal of original data at the current byte position (316). More specifically, path block 232 is configured to select the longest and closest match at the current byte position and merge consecutive matches to form a longer match. Path block 232 may also be configured to support lazy match in which path block 232 determines whether it is better to output a length-distance pair to represent a match beginning at the current byte position or to output a literal for the current byte position based on matches at other byte positions within a configurable window. Search block 206 then transmits the selected output for the current byte position in an output data stream (318).

Various examples have been described. These and other examples are within the scope of the following claims.

What is claimed is:

1. A method comprising:
receiving, by a search engine implemented as a pipeline of a processing device, an input data stream to be compressed;
identifying, by a first block in the pipeline of the search engine, one or more dictionary addresses of one or more words having different word lengths stored in a static dictionary that potentially match a current byte string beginning at a current byte position in the input data stream, wherein the static dictionary stores a predefined list of common words having the different word lengths;
identifying, by the first block in the pipeline of the search engine, one or more history addresses of one or more previous occurrences of byte strings stored in a history buffer that potentially match the current byte string beginning at the current byte position in the input data stream, wherein the history buffer stores a self-referential dynamic history of bytes previously seen in the input data stream;
sending, by the first block to a second block in the pipeline of the search engine, the one or more dictionary addresses and the one or more history addresses;
determining, by the second block in the pipeline of the search engine, whether at least one first match occurs for the current byte string beginning at the current byte position from among the one or more words stored at the dictionary addresses in the static dictionary, and whether at least one second match occurs for the current byte string beginning at the current byte position from among the one or more previous occurrences of byte strings stored at the history addresses in the history buffer;
sending, by the second block to a third block in the pipeline of the search engine, a set of first indications of whether the first match occurs for the current byte string beginning at the current byte position at the different word lengths from the static dictionary, wherein sending the set of first indications comprises sending each indication of the set of indications on a dedicated line for each word length of the different word lengths from the static dictionary to the third block;
sending, by the second block to the third block, a second indication of whether the at least one second match occurs for the current byte string beginning at the current byte position from the history buffer;
selecting, by the third block in the pipeline of the search engine, an output for the current byte position, wherein the output for the current byte position comprises one of a reference to a best match for the current byte string beginning at the current byte position determined from the at least one first match from the static dictionary and the at least one second match from the history buffer, or a literal of original data at the current byte position; and
transmitting, by the search engine, the selected output for the current byte position in an output data stream.

2. The method of claim 1, wherein the first block in the pipeline of the search engine comprises a hash block that include a history address hash table, and wherein the static dictionary comprises a dictionary hash table, wherein identifying the one or more dictionary addresses comprises computing, by the hash block of the search engine, a set of dictionary hash indices based on the current byte string beginning at the current byte position, wherein each dictionary hash index of the set of dictionary hash indices identifies a respective word having a respective word length of the different word lengths stored in the dictionary hash table; and wherein identifying the one or more history addresses comprises identifying, by the hash block of the search engine, the one or more history addresses stored in the history address hash table identified by a history hash index computed from the current byte string beginning at the current byte position.

3. The method of claim 2,
wherein identifying the one or more dictionary addresses comprises:
generating, by the hash block, a dictionary hash key from the current byte string beginning at the current byte position in the input data stream; and
computing, by the hash block using a dictionary hash function, a respective dictionary hash index of the set of dictionary hash indices for each word length of the different word lengths from the dictionary hash key truncated for each word length of the different word lengths as the one or more dictionary addresses; and wherein identifying the one or more history addresses comprises:
generating, by the hash block, a history hash key from the current byte string beginning at the current byte position in the input data stream;
computing, by the hash block, a history hash index from the history hash key using a history hash function;
accessing, by the hash block, a hash bucket of the history address hash table identified by the history hash index; and
reading, by the hash block and during the history address hash table access, the one or more history addresses from the hash bucket identified by the history hash index.

4. The method of claim 1, wherein the second block in the pipeline of the search engine comprises a match block, and wherein determining whether the at least one first match occurs for the current byte string beginning at the current byte position comprises:
receiving, by the match block of the search engine, the one or more dictionary addresses of the one or more words;
reading, by the match block, the one or more words having the different word lengths stored at the one or more dictionary addresses in the static dictionary; and
comparing, by the match block, the current byte string beginning at the current byte position to each of the one or more words having the different word lengths.

5. The method of claim 1, wherein, when the first match occurs for the current byte string beginning at the current byte position at a first word having a first word length of the different word lengths, sending a respective indication of the set of first indications for the first word length comprises sending the literal of original data at the current byte position and an indication that the first match occurred on the dedicated line for the first word length of the different word lengths.

6. The method of claim 5, wherein, when the first match does not occur for the current byte string beginning at the current byte position at a second word having a second word length of the different word lengths, sending a respective indication of the set of first indications for the second word length comprises sending the literal of original data at the current byte position and an indication that the first match did not occur on the dedicated line for the second word length of the different word lengths.

7. The method of claim 1,
wherein determining whether the at least one first match occurs for the current byte string from the static dictionary comprises comparing the current byte string beginning at the current byte position to each of the one or more words having the different word lengths; and
wherein determining whether the at least one second match occurs for the current byte string from the history buffer comprises comparing the current byte string beginning at the current byte position to each of the one or more previous occurrences of byte strings beginning at the history addresses on a byte-by-byte basis up to a non-matching byte.

8. The method of claim 1, wherein each of the static dictionary and the history buffer is configured to include multiple memory banks, wherein determining whether the at least one first match occurs for the current byte string comprises scheduling as many accesses as possible for the dictionary addresses to different memory banks of the static history during one or more clock cycles, and wherein determining whether the at least one second match occurs for the current byte string comprises scheduling as many accesses as possible for the history addresses to different memory banks of the history buffer during the one or more clock cycles.

9. The method of claim 8, further comprising, when a scheduling entry for one of the dictionary addresses or one of the history addresses cannot be rescheduled during a subsequent clock cycle, discarding the scheduling entry for the one of the dictionary addresses or the one of the history addresses.

10. The method of claim 1, wherein the third block in the pipeline of the search engine comprises a path block, the method further comprising:
receiving, by the path block of the search engine, the set of first indications of whether the first match occurs for the current byte string beginning at the current byte position at the different word lengths from the static dictionary;
receiving, by the path block, the second indication of whether the at least one second match occurs for the current byte string beginning at the current byte position from the history buffer; and
determining, by the path block of the search engine, the best match for each of one or more byte positions within a window of the input data stream that includes the current byte position from the at least one first match from the static dictionary and the at least one second match from the history buffer,
wherein selecting the output for the current byte position comprises one of:
if the best match for the current byte position is a longest match within the window, selecting as the output a length-distance pair identifying the best match for the current byte position; or
if the best match for the current byte position is not the longest match within the window, selecting as the output the literal of the original data at the current byte position.

11. The method of claim 10, wherein the longest match within the window comprises the first match for the current byte string at a first word having a first word length of the different word lengths from the static dictionary, and wherein the length-distance pair identifying the best match for the current byte string includes a length set equal to the first word length of the first word and a distance set to a sum of a maximum size of the history buffer and an offset of the first word in the static dictionary.

12. The method of claim 1,
wherein the static dictionary is configured to include multiple small memory banks, each of the small memory banks storing a plurality of common words having one of the different word lengths from the predefined list of common words; and
wherein the history buffer is configured to include multiple large memory banks storing a full dynamic history of the input data stream across all of the large memory banks.

13. The method of claim 1,
wherein the static dictionary is configured to include multiple large memory banks, each of the large memory banks storing a plurality of common words having one of the different word lengths from the predefined list of common words; and
wherein the history buffer is configured to include multiple small memory banks storing a most recent portion of a full dynamic history of the input data stream across all of the small memory banks.

14. A processing device comprising:
a memory; and
a search engine implemented as a pipeline of the processing device, the search engine configured to:
receive an input data stream to be compressed,
identify, by a first block in the pipeline of the search engine, one or more dictionary addresses of one or more words having different word lengths stored in a static dictionary that potentially match a current byte string beginning at a current byte position in the input data stream, wherein the static dictionary stores a predefined list of common words having the different word lengths,
identify, by the first block in the pipeline, one or more history addresses of one or more previous occurrences of byte strings stored in a history buffer that potentially match the current byte string beginning at the current byte position in the input data stream, wherein the history buffer stores a self-referential dynamic history of bytes previously seen in the input data stream,
send, by the first block to a second block in the pipeline, the one or more dictionary addresses and the one or more history addresses;
determine, by the second block in the pipeline, whether at least one first match occurs for the current byte string beginning at the current byte position from among the one or more words stored at the dictionary addresses in the static dictionary, and whether at least one second match occurs for the current byte string beginning at the current byte position from among the one or more previous occurrences of byte strings stored at the history addresses in the history buffer,
send, by the second block to a third block in the pipeline, a set of first indications of whether the first match occurs for the current byte string beginning at the current byte position at the different word lengths from the static dictionary, wherein to send the set of first indications, the second block is configured to send each indication of the set of indications on a dedicated line for each word length of the different word lengths from the static dictionary to the third block;
send, by the second block to the third block, a second indication of whether the at least one second match occurs for the current byte string beginning at the current byte position from the history buffer;
select, by the third block in the pipeline, an output for the current byte position, wherein the output for the current byte position comprises one of a reference to a best match for the current byte string beginning at the current byte position determined from the at least one first match from the static dictionary and the at least one second match from the history buffer, or a literal of original data at the current byte position, and
transmit the selected output for the current byte position in an output data stream.

15. The device of claim 14, wherein the first block in the pipeline of the search engine comprises a hash block that include a history address hash table, and wherein the static dictionary comprises a dictionary hash table,
wherein, to identify the one or more dictionary addresses, the hash block of the search engine is configured to compute a second of dictionary hash indices based on the current byte string beginning at the current byte position, wherein each dictionary hash index of the set of dictionary hash indices identifies a respective word having a respective word length of the different word lengths stored in the dictionary hash table; and
wherein, to identify the one or more history addresses, the hash block of the search engine is configured to identify the one or more history addresses stored in the history address hash table identified by a history hash index computed from the current byte string beginning at the current byte position.

16. The device of claim 15,
wherein, to identify the one or more dictionary addresses, the hash block is configured to:
generate a dictionary hash key from the current byte string beginning at the current byte position in the input data stream; and
compute, using a dictionary hash function, a respective dictionary hash index of the set of dictionary hash indices for each word length of the different word lengths from the dictionary hash key truncated for each word length of the different word lengths as the one or more dictionary addresses; and
wherein, to identify the one or more history addresses, the hash block is configured to:
generate a history hash key from the current byte string beginning at the current byte position in the input data stream;
compute a history hash index from the history hash key using a history hash function;
access a hash bucket of the history address hash table identified by the history hash index; and
read, during the history address hash table access, the one or more history addresses from the hash bucket identified by the history hash index.

17. The device of claim 14, wherein the second block in the pipeline of the search engine comprises a match block, and wherein, to determine whether the at least one match occurs for the current byte string beginning at the current byte position, the match block of the search engine is configured to:

receive the one or more dictionary addresses of the one or more words;

read the one or more words having the different word lengths stored at the one or more dictionary addresses in the static dictionary; and compare the current byte string beginning at the current byte position to each of the one or more words having the different word lengths.

18. The device of claim 14, wherein, to send a respective indication of the set of first indications for a first word length, the match block is configured to, when the first match occurs for the current byte string beginning at the current byte position at a first word having the first word length of the different word lengths, send the literal of original data at the current byte position and an indication that the first match occurred on the dedicated line for the first word length of the different word lengths.

19. The device of claim 18, wherein, to send a respective indication of the set of first indications for a second word length, the match block is configured to, when the first match does not occur for the current byte string beginning at the current byte position at a second word having the second word length of the different word lengths, send the literal of original data at the current byte position and an indication that the first match did not occur on the dedicated line for the second word length of the different word lengths.

20. The method of claim 1, wherein the output data stream comprises output of a first stage of a two-stage compression process, and wherein transmitting the output data stream comprises transmitting the output data stream to another processing device for entropy coding of the output data stream as a second stage of the two-stage compression process.

21. The device of claim 14,
wherein, to determine whether the at least one first match occurs for the current byte string from the static dictionary, the search engine is configured to compare the current byte string beginning at the current byte position to each of the one or more words having the different word lengths; and
wherein, to determine whether the at least one second match occurs for the current byte string from the history buffer, the search engine is configured to compare the current byte string beginning at the current byte position to each of the one or more previous occurrences of byte strings beginning at the history addresses on a byte-by-byte basis up to a non-matching byte.

22. The device of claim 14, wherein each of the static dictionary and the history buffer is configured to include multiple memory banks, wherein, to determine whether the at least one first match occurs for the current byte string, the search engine is configured to schedule as many accesses as possible for the dictionary addresses to different memory banks of the static history during one or more clock cycles, and wherein, to determine whether the at least one second match occurs for the current byte string, the search engine is configured to schedule as many accesses as possible for the history addresses to different memory banks of the history buffer during the one or more clock cycles.

23. The device of claim 22, wherein the search engine is configured to, when a scheduling entry for one of the dictionary addresses or one of the history addresses cannot be rescheduled during a subsequent clock cycle, discard the scheduling entry for the one of the dictionary addresses or the one of the history addresses.

24. The device of claim 14, wherein the third block in the pipeline of the search engine comprises a path block, and wherein a path block of the search engine is configured to:
receive the set of first indications of whether the first match occurs for the current byte string beginning at the current byte position at the different word lengths from the static dictionary;
receive the second indication of whether the at least one second match occurs for the current byte string beginning at the current byte position from the history buffer; and
determine the best match for each of one or more byte positions within a window of the input data stream that includes the current byte position from the at least one first match from the static dictionary and the at least one second match from the history buffer,
wherein, to select the output for the current byte position, the path block is configured to one of:
if the best match for the current byte position is a longest match within the window, select as the output a length-distance pair identifying the best match for the current byte position; or
if the best match for the current byte position is not the longest match within the window, select as the output the literal of the original data at the current byte position.

25. The device of claim 24, wherein the longest match within the window comprises the first match for the current byte string at a first word having a first word length of the different word lengths from the static dictionary, and wherein the length-distance pair identifying the best match for the current byte string includes a length set equal to the first word length of the first word and a distance set to a sum of a maximum size of the history buffer and an offset of the first word in the static dictionary.

26. The device of claim 14,
wherein the static dictionary is configured to include multiple small memory banks, each of the small memory banks storing a plurality of common words having one of the different word lengths from the predefined list of common words; and
wherein the history buffer is configured to include multiple large memory banks storing a full dynamic history of the input data stream across all of the large memory banks.

27. The device of claim 14,
wherein the static dictionary is configured to include multiple large memory banks, each of the large memory banks storing a plurality of common words having one of the different word lengths from the predefined list of common words; and
wherein the history buffer is configured to include multiple small memory banks storing a most recent portion of a full dynamic history of the input data stream across all of the small memory banks.

28. The device of claim 14, wherein the output data stream comprises output of a first stage of a two-stage compression process, and wherein the search engine transmits the output data stream to another processing device for entropy coding of the output data stream as a second stage of the two-stage compression process.

* * * * *